US011996419B2

United States Patent
Okamoto et al.

(10) Patent No.: US 11,996,419 B2
(45) Date of Patent: May 28, 2024

(54) LIGHT DETECTOR, LIGHT DETECTION SYSTEM, LIDAR DEVICE, MOBILE BODY, AND VEHICLE

(71) Applicant: KABUSHIKI KAISHA TOSHIBA, Tokyo (JP)

(72) Inventors: Kazuaki Okamoto, Yokohama Kanagawa (JP); Honam Kwon, Kawasaki Kanagawa (JP); Mariko Shimizu, Setagaya Tokyo (JP); Kazuhiro Suzuki, Meguro Tokyo (JP); Keita Sasaki, Yokohama Kanagawa (JP); Ikuo Fujiwara, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 400 days.

(21) Appl. No.: 17/445,590

(22) Filed: Aug. 20, 2021

(65) Prior Publication Data
US 2022/0223631 A1 Jul. 14, 2022

(30) Foreign Application Priority Data

Jan. 8, 2021 (JP) ................................. 2021-002071

(51) Int. Cl.
*H01L 27/144* (2006.01)
*G01S 7/481* (2006.01)
(Continued)

(52) U.S. Cl.
CPC ........ *H01L 27/1446* (2013.01); *G01S 7/4816* (2013.01); *G01S 17/10* (2013.01);
(Continued)

(58) Field of Classification Search
CPC ........... H01L 27/1446; H01L 31/02327; H01L 31/03529; H01L 31/107; G01S 7/4816; G01S 17/10
See application file for complete search history.

(56) References Cited

U.S. PATENT DOCUMENTS

2014/0117484 A1\* 5/2014 Yamamoto .......... H01L 27/1446
257/438
2015/0035102 A1 2/2015 Ashidate
(Continued)

FOREIGN PATENT DOCUMENTS

JP S60-60756 A 4/1985
JP 2008-103614 A 5/2008
(Continued)

*Primary Examiner* — Thanh Luu
(74) *Attorney, Agent, or Firm* — Finnegan, Henderson, Farabow, Garrett & Dunner, LLP

(57) ABSTRACT

According to one embodiment, a light detector includes a plurality of elements. Each of the elements includes a first semiconductor region, a second semiconductor region, and a third semiconductor region. The second semiconductor region is located on the first semiconductor region and has a higher first-conductivity-type impurity concentration than the first semiconductor region. The third semiconductor region is located on the second semiconductor region. The elements are arranged at a first period in a second direction crossing a first direction. The first direction is from the first semiconductor region toward the second semiconductor region. A quenching part is electrically connected with the third semiconductor region. Multiple lenses are located respectively on the elements. One of the lenses is positioned on one of the elements. A refracting layer is located between the elements and the lenses. The refracting layer has a first thickness.

20 Claims, 19 Drawing Sheets

(51) Int. Cl.
*G01S 17/10* (2020.01)
*H01L 31/0232* (2014.01)
*H01L 31/0352* (2006.01)
*H01L 31/107* (2006.01)

(52) U.S. Cl.
CPC .. *H01L 31/02327* (2013.01); *H01L 31/03529* (2013.01); *H01L 31/107* (2013.01)

(56) References Cited

U.S. PATENT DOCUMENTS

| | | |
|---|---|---|
| 2018/0372872 A1 | 12/2018 | Kwon et al. |
| 2019/0165198 A1 | 5/2019 | Kwon et al. |
| 2020/0025934 A1 | 1/2020 | Kwon et al. |
| 2020/0058821 A1 | 2/2020 | Baba et al. |
| 2020/0292675 A1 | 9/2020 | Kubota et al. |
| 2021/0132230 A1 | 5/2021 | Fujiwara et al. |
| 2021/0280622 A1 | 9/2021 | Maeda et al. |

FOREIGN PATENT DOCUMENTS

| | | |
|---|---|---|
| JP | 2014-90034 A | 5/2014 |
| JP | 2015-32636 A | 2/2015 |
| JP | 2019-9436 A | 1/2019 |
| JP | 2020-13950 A | 1/2020 |
| JP | 2020-148644 A | 9/2020 |
| JP | 2021-72347 A | 5/2021 |
| WO | WO2018/088479 A1 | 5/2018 |
| WO | WO 2020/003972 A1 | 1/2020 |

\* cited by examiner

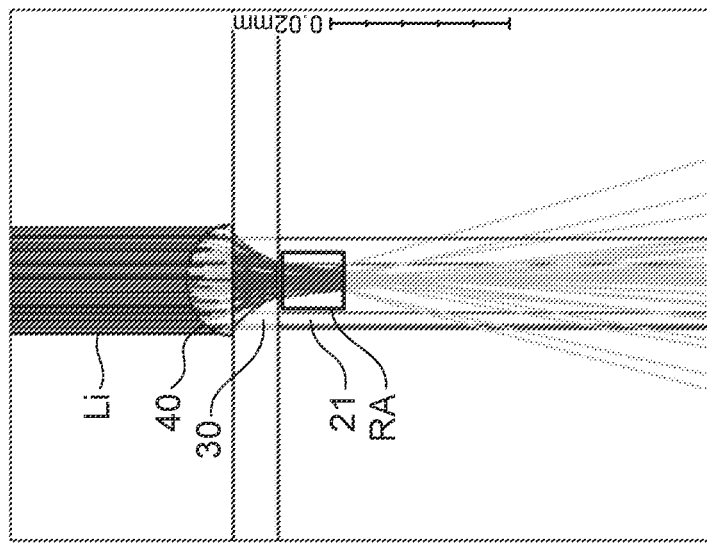
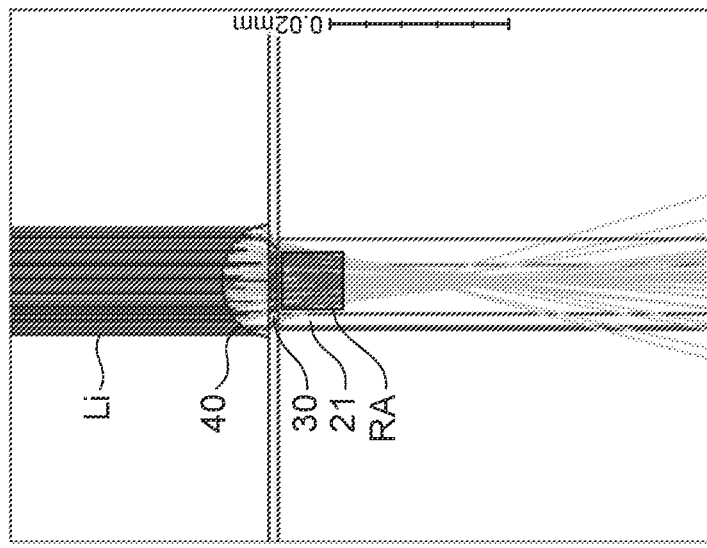
FIG. 18A  FIG. 18B  FIG. 18C

LIGHT DETECTOR, LIGHT DETECTION SYSTEM, LIDAR DEVICE, MOBILE BODY, AND VEHICLE

CROSS-REFERENCE TO RELATED APPLICATIONS

This application is based upon and claims the benefit of priority from Japanese Patent Application No. 2021-002071, filed on Jan. 8, 2021; the entire contents of which are incorporated herein by reference.

FIELD

Embodiments described herein relate generally to a light detector, a light detection system, a lidar device, a mobile body, and a vehicle.

BACKGROUND

There is a light detector that detects light incident on a semiconductor region. It is desirable to improve the performance of the light detector.

BRIEF DESCRIPTION OF THE DRAWINGS

FIGS. 18A to 18C are schematic cross-sectional views illustrating calculation results of the optical path of the light detector;

DETAILED DESCRIPTION

Figure 1:
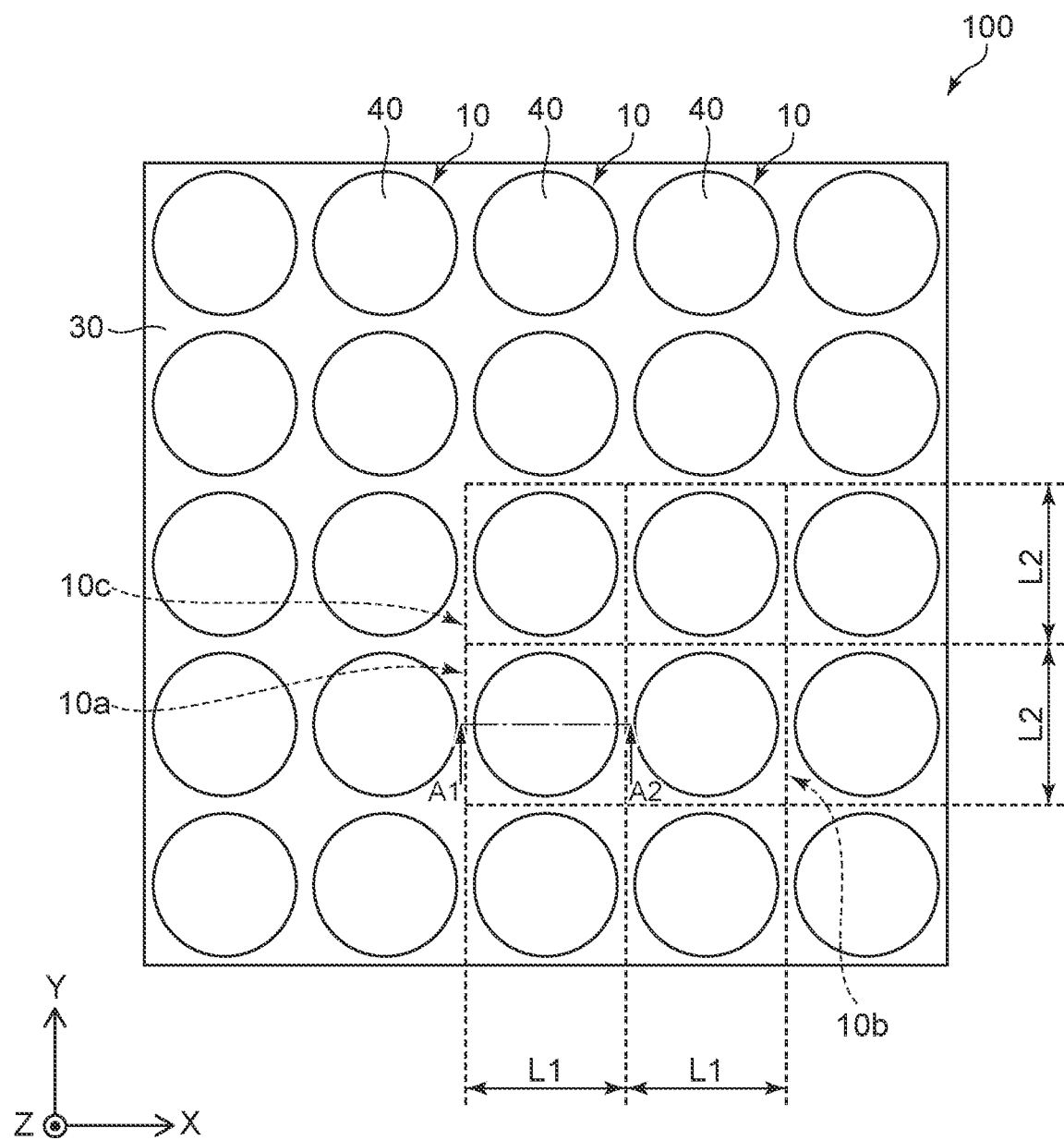
FIG. 1 is a schematic plan view illustrating a light detector according to a first embodiment.

According to one embodiment, a light detector includes a plurality of elements. Each of the elements includes a first semiconductor region of a first conductivity type, a second semiconductor region of the first conductivity type, and a third semiconductor region of a second conductivity type. The second semiconductor region is located on the first semiconductor region and has a higher first-conductivity-type impurity concentration than the first semiconductor region. The third semiconductor region is located on the second semiconductor region. The elements are arranged at a first period in a second direction crossing a first direction. The first direction is from the first semiconductor region toward the second semiconductor region. A quenching part is electrically connected with the third semiconductor region. A plurality of lenses are located respectively on the elements. One of the lenses is positioned on one of the elements. A refracting layer is located between the elements and the lenses. The refracting layer has a first thickness. A ratio of the first thickness to the first period is not less than 0.16 and not more than 0.72.

According to one embodiment, a light detection system includes the light detector described above, and a distance measuring circuit calculating a time-of-flight of light from an output signal of the light detector.

According to one embodiment, a lidar device includes a light source irradiating light on an object, and the light detection system described above. The system detects light reflected by the object.

According to one embodiment, a mobile body includes the lidar device described above.

According to one embodiment, a vehicle includes a plurality of the lidar devices described above, and a vehicle body. The lidar devices are located at four corners of the vehicle body.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic plan view illustrating a light detector according to a first embodiment.

As illustrated in FIG. 1, the light detector 100 according to the first embodiment includes multiple elements 10 (light-receiving elements), a refracting layer 30, and multiple lenses 40. The refracting layer 30 is located on the multiple elements 10; and the lenses 40 are located on the refracting layer 30.

The multiple elements 10 are arranged in an array configuration or a lattice shape along the X-Y plane. For example, the multiple elements 10 are arranged periodically at a uniform pitch in an X-axis direction and a Y-axis direction.

In the description of embodiments, a direction that crosses the X-Y plane or a direction from a first semiconductor region 11 (referring to FIG. 2A) toward a second semiconductor region 12 (referring to FIG. 2A) described below are taken as a Z-axis direction. A direction perpendicular to the Z-axis direction is taken as the X-axis direction (a second direction). A direction perpendicular to the Z-axis direction and the X-axis direction is taken as the Y-axis direction (a third direction). In the description, the direction from the first semiconductor region 11 toward the second semiconductor region 12 is called "up", and the opposite direction is called "down". These directions are based on the relative positional relationship between the first semiconductor region 11 and the second semiconductor region 12 and are independent of the direction of gravity. "Up" corresponds to the side of the light detector at which the lenses 40 are mounted and the light is incident.

The multiple lenses 40 are respectively located on the multiple elements 10. In other words, the multiple lenses 40 are arranged to match the period of the multiple elements 10; and one of the multiple lenses 40 is positioned on one of the multiple elements 10. The multiple lenses 40 are, for example, a microlens array. The microlens array increases the light-receiving sensitivity of the light detector by refracting the optical path of the light that is irradiated on an area at which the light-receiving element is not provided to modify the optical path to irradiate the light into the light-receiving element.

The multiple elements 10 are arranged at a first period L1 in the X-axis direction and are arranged at a second period L2 in the Y-axis direction. In one element 10 of the example, the length in the X-axis direction and the length in the Y-axis direction are substantially the same. Also, in the example, when viewed from the Z-axis direction, the shapes of the multiple elements 10 are substantially the same, and the first period L1 and the second period L2 are substantially equal.

For example, the multiple elements 10 include a first element 10a, a second element 10b, and a third element 10c. The second element 10b is adjacent to the first element 10a in the X-axis direction. The third element 10c is adjacent to the first element 10a in the Y-axis direction. The period (the pitch) is the repeating unit length between positions. The first period L1 corresponds to the length connecting the X-axis direction center of the first element 10a and the X-axis direction center of the second element 10b. The second period L2 corresponds to the length connecting the Y-axis direction center of the first element 10a and the Y-axis direction center of the third element 10c. For example, among the other elements 10 that are adjacent to the first element 10a, the element 10 that minimizes the distance connecting the center of the first element 10a and the center of the other element is taken as the second element 10b.

Figure 2A:
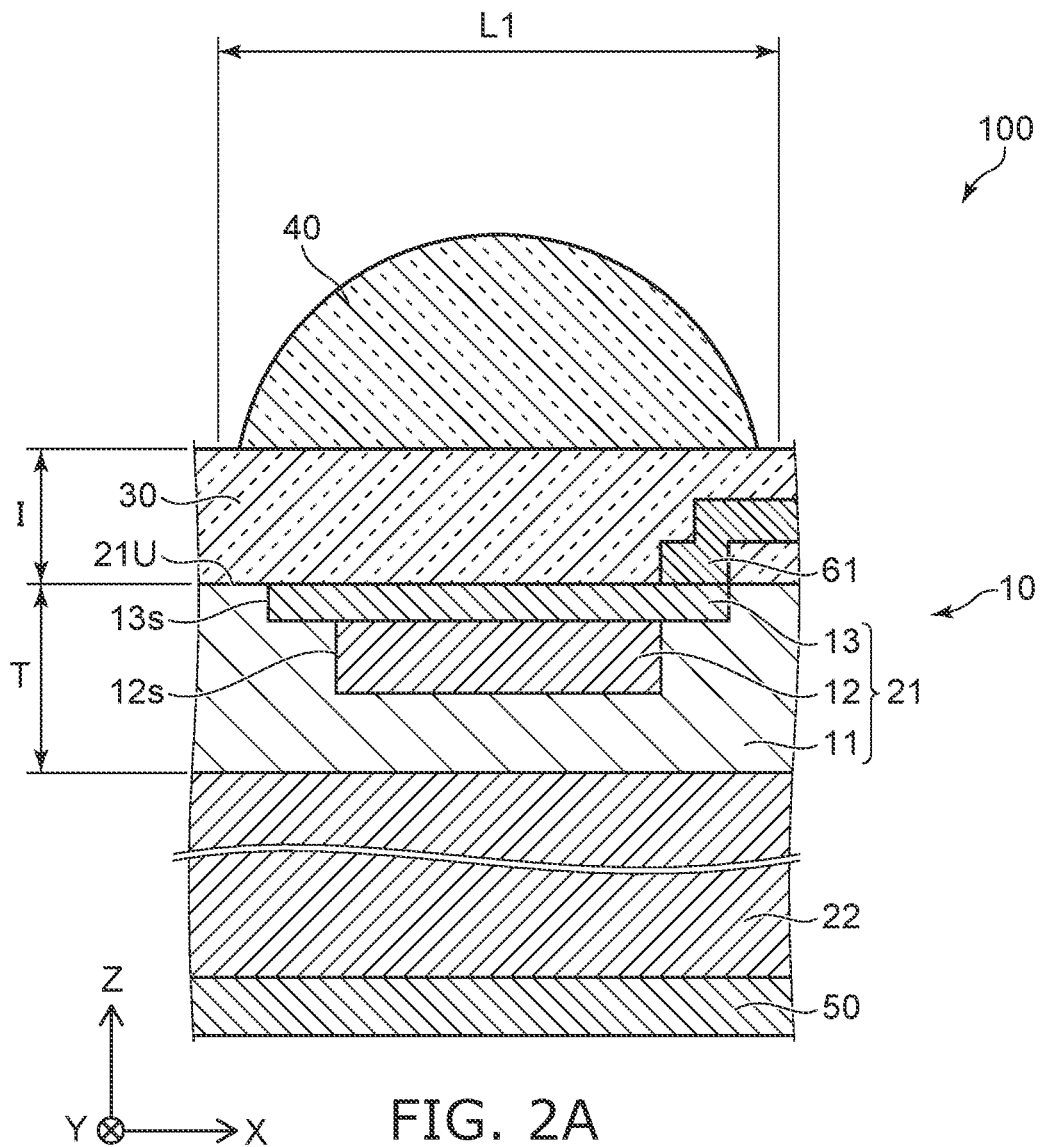
FIGS. 2A and 2B are schematic views illustrating a portion of the light detector according to the first embodiment.
Figure 2B:
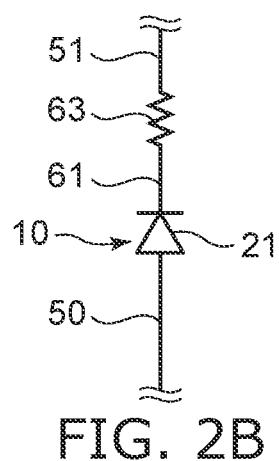

FIGS. 2A and 2B are schematic views illustrating a portion of the light detector according to the first embodiment.

FIG. 2A is a line A1-A2 cross section shown in FIG. 1. Namely, FIG. 2A is a cross section of one part of the light detector 100 shown in FIG. 1, that is, one period of the periodic structure. As illustrated in FIG. 2A, the light detector 100 includes an electrode 50, a semiconductor layer 22 (a second semiconductor layer), the element 10 (the first semiconductor region 11, the second semiconductor region 12, and a third semiconductor region 13), the refracting layer 30, the lens 40, and a conductive part 61. FIG. 2B is a circuit diagram corresponding to FIG. 2A. As illustrated in FIG. 2B, the light detector 100 further includes a quenching part 63 and a first interconnect 51. The quenching part 63 and the first interconnect 51 are not illustrated in FIG. 2A for convenience. Interconnects, etc., also are not illustrated in FIG. 1.

The electrode 50 is, for example, a back electrode. The semiconductor layer 22 is located on the electrode 50 and is electrically connected with the electrode 50. The semiconductor layer 22 is, for example, a semiconductor substrate of a first conductivity type.

The first semiconductor region 11 is located on the semiconductor layer 22 and contacts the semiconductor layer 22. The first semiconductor region 11 is of the first conductivity type and is electrically connected with the semiconductor layer 22.

The second semiconductor region 12 is located on the first semiconductor region 11 and contacts the first semiconductor region 11. The second semiconductor region 12 is of the first conductivity type and is electrically connected with the first semiconductor region 11. The first-conductivity-type impurity concentration of the second semiconductor region 12 is greater than the first-conductivity-type impurity concentration of the first semiconductor region 11.

The third semiconductor region 13 is located on the second semiconductor region 12 and contacts the second semiconductor region 12. The third semiconductor region 13 is of a second conductivity type and is electrically connected with the second semiconductor region 12.

The first conductivity type is one of a p-type or an n-type. The second conductivity type is the other of the p-type or the n-type. Hereinbelow, the first conductivity type is described as the p-type, and the second conductivity type is described as the n-type.

The first semiconductor region 11, the second semiconductor region 12, and the third semiconductor region 13 are, for example, regions that are located in one semiconductor layer 21 (a first semiconductor layer). A p-n junction is formed at the interface between the second semiconductor region 12 and the third semiconductor region 13. For example, the second semiconductor region 12 and the third semiconductor region 13 are diffusion layers located in the semiconductor layer 21. A photodiode is formed of the second and third semiconductor regions 12 and 13. The multiple elements 10 each include the first semiconductor region 11, the second semiconductor region 12, and the third semiconductor region 13.

In the example, the width of the third semiconductor region 13 is greater than the width of the second semiconductor region 12. The "width" is the length along a direction (e.g., the X-axis direction) perpendicular to the Z-axis direction. However, according to embodiments, the width of the third semiconductor region 13 may be equal to the width of the second semiconductor region 12. The second semiconductor region 12 and the third semiconductor region 13 are arranged with portions of the first semiconductor region 11 in a direction perpendicular to the Z-axis direction. In other words, the second semiconductor region 12 and the third semiconductor region 13 are surrounded with the first semiconductor region 11 along the X-Y plane. A side surface 12s of the second semiconductor region 12 and a side surface 13s of the third semiconductor region 13 contact the first semiconductor region 11. The center of the second semiconductor region 12 or the center of the third semiconductor region 13 corresponds to the center of the element 10 in a direction perpendicular to the Z-axis direction.

The semiconductor layer 21 (the first semiconductor region 11, the second semiconductor region 12, and the third semiconductor region 13) and the semiconductor layer 22 include at least one semiconductor material selected from the group consisting of silicon, silicon carbide, gallium arsenide, and gallium nitride. For example, the semiconductor layer 21 and the semiconductor layer 22 include silicon. For example, the first-conductivity-type impurity concentration of the semiconductor layer 22 is greater than the first-conductivity-type impurity concentration of the first semiconductor region 11. The second semiconductor region 12 is obtained by implanting, for example, boron as a p-type impurity into silicon. The third semiconductor region 13 is obtained by implanting, for example, phosphorus, arsenic, or antimony as an n-type impurity into silicon. The semiconductor layer 21 is, for example, an epitaxial layer that is formed on a substrate. For example, the (100) plane of the single-crystal silicon that is included in the semiconductor layers 21 and 22 is perpendicular to the Z-axis direction.

The refracting layer 30 is located between the multiple elements 10 (the semiconductor layers 21) and the multiple lenses 40. The refracting layer 30 contacts the light-receiving surfaces of the multiple elements 10, i.e., upper surface 21U of the semiconductor layer 21. The refracting layer 30 contacts the multiple lenses 40. It is favorable for the thickness of the refracting layer 30 to be not less than 1 μm (micrometers) and not more than 10 μm, and more favorably not less than 2 μm and not more than 8 μm.

The refracting layer 30 is, for example, an insulating layer. For example, a light-transmissive material is included in the refracting layer 30. The refracting layer 30 includes silicon and one selected from the group consisting of oxygen and nitrogen. For example, the refracting layer 30 includes at least one of silicon oxide or silicon nitride. The refractive index of the refracting layer 30 is, for example, not less than 1.4 and not more than 2. In this specification, the refractive index is the absolute refractive index.

The thickness (the length along the Z-axis direction) of the refracting layer 30 is taken as a first thickness I. As described below, it is favorable for the ratio of the first thickness I to the first period L1 (first thickness/first period=I/L1) to be, for example, not less than 0.16 and not more than 0.72, and more favorably not less than 0.24 and not more than 0.64.

The conductive part 61 is located on the third semiconductor region 13 and contacts the third semiconductor region 13. The conductive part 61 is electrically connected with the third semiconductor region 13. In the example, at least a portion of the conductive part 61 is located in the refracting layer 30. At least a portion of the conductive part 61 is arranged with a portion of the refracting layer 30 in the X-axis direction and the Y-axis direction; that is, when viewed from the Z-axis direction, at least a portion of the conductive part 61 includes a region that does not overlap a portion of the refracting layer 30 and is surrounded with the refracting layer 30 along the X-Y plane. A short-circuit due to the conductive part 61 contacting the outside can be suppressed thereby.

The quenching part 63 is electrically connected with the conductive part 61. Thereby, one end of the quenching part 63 is electrically connected with the third semiconductor region 13 via the conductive part 61. Multiple quenching parts 63 are provided; and the multiple quenching parts 63 are electrically connected respectively with the multiple semiconductor regions 13. Another end of the quenching part 63 is electrically connected with the first interconnect 51.

For example, the quenching part 63 is a quenching resistance; and the electrical resistance of the quenching part 63 is greater than the electrical resistance of the conductive part 61. The quenching part 63 includes, for example, polysilicon as a resistor. An n-type impurity or a p-type impurity may be added to the quenching part 63. The resistance of the quenching part 63 is, for example, not less than 50 kΩ and not more than 2 MΩ.

The electrode 50, the conductive part 61, and the interconnects include, for example, at least one metal selected from the group consisting of titanium, tungsten, copper, gold, and aluminum. The electrode 50 and the conductive part 61 are, for example, aluminum (or an aluminum-including material), copper (or a copper-including material), gold (or a gold-including material), indium tin oxide (ITO), or a combination of another metal material and these materials.

The lens 40 is located on the refracting layer 30. For example, one lens 40 is positioned on one element 10. The upper surface of the lens 40 is upwardly convex. The lens 40 concentrates light toward the element 10. In the example, the shape of the lens 40 is substantially circular when viewed from the Z-axis direction; and the adjacent lenses 40 are separated from each other (referring to FIG. 1). It is favorable for the width of the lens 40 to be not less than 8 μm and not more than 30 μm, and more favorably not less than 10 μm and not more than 15 μm. The curvature radius of the upper surface of the lens 40 is, for example, not less than 4 μm and not more than 10 μm.

The lens 40 includes a light-transmissive resin. The resin includes, for example, an acrylic resin. The lens 40 can include, for example, an acrylic resin (TMR-C006) made by Tokyo Ohka Kogyo Co., Ltd. For example, the lenses 40 are formed by coating a transparent planarization film and a photosensitive microlens resin on the refracting layer 30, by using photolithography technology to form a resin pattern having about the same period as the light-receiving elements, and by subsequently causing thermal deformation of the resin pattern by heat treatment. It is favorable for the refractive index of the microlens resin used to make the lens 40 to be not less than 1.4 and not more than 2. For example, the refractive index of the lens 40 is greater than the refractive index of the refracting layer 30. The refractive index of the lens 40 may be less than the refractive index of the refracting layer 30.

Operations of the light detector 100 will now be described.

The light that is incident on the light detector 100 from above passes through the lens 40 and is incident on the refracting layer 30. The light that is incident on the refracting layer 30 passes through the refracting layer 30 and is incident on the element 10 (the semiconductor layer 21). A charge is generated in the semiconductor layer 21 when the light is incident on the element 10. When the charge is generated, a current flows in the quenching part 63 and the first interconnect 51. The incidence of the light on the element 10 can be detected by detecting the current that flows in the first interconnect 51.

The conductive part 61 and the electrode 50 drive the light-receiving element by applying a voltage to the second and third semiconductor regions 12 and 13. The electrical signal that is generated by the photoelectric conversion in the second semiconductor region 12 is output to a driver/reader (not illustrated in the drawings) via the quenching part 63, the first interconnect 51, etc. A voltage is applied between the second semiconductor region 12 and the third semiconductor region 13 by controlling the potential of the electrode 50. For example, a reverse voltage is applied between the second semiconductor region 12 and the third semiconductor region 13. The element 10 functions as an avalanche photodiode. A reverse voltage that is greater than the breakdown voltage may be applied between the second semiconductor region 12 and the third semiconductor region 13. In other words, the element 10 may operate in a Geiger mode. By operating in a Geiger mode, a pulse signal that has a high gain and a short time constant is output. The light-receiving sensitivity of the light detector 100 can be increased thereby.

The quenching part 63 is provided to suppress the continuation of the avalanche breakdown that occurs when light is incident on the element 10. A voltage drop that corresponds to the electrical resistance of the quenching part 63 occurs when avalanche breakdown occurs and a current flows in the quenching part 63. The potential difference between the second semiconductor region 12 and the third semiconductor region 13 is reduced by the voltage drop; and the avalanche breakdown stops. The next light that is incident on the element 10 can be detected thereby.

As described above, a resistor that generates a large voltage drop may be provided as the quenching part 63; instead of a resistor, a control circuit that blocks the current may be provided as the quenching part 63. For example, the control circuit includes a comparator, a control logic part, and two switching elements. An active quenching circuit is applicable to the control circuit. The active quenching circuit can have a known configuration.

Figures 3A, 3B, 3C:
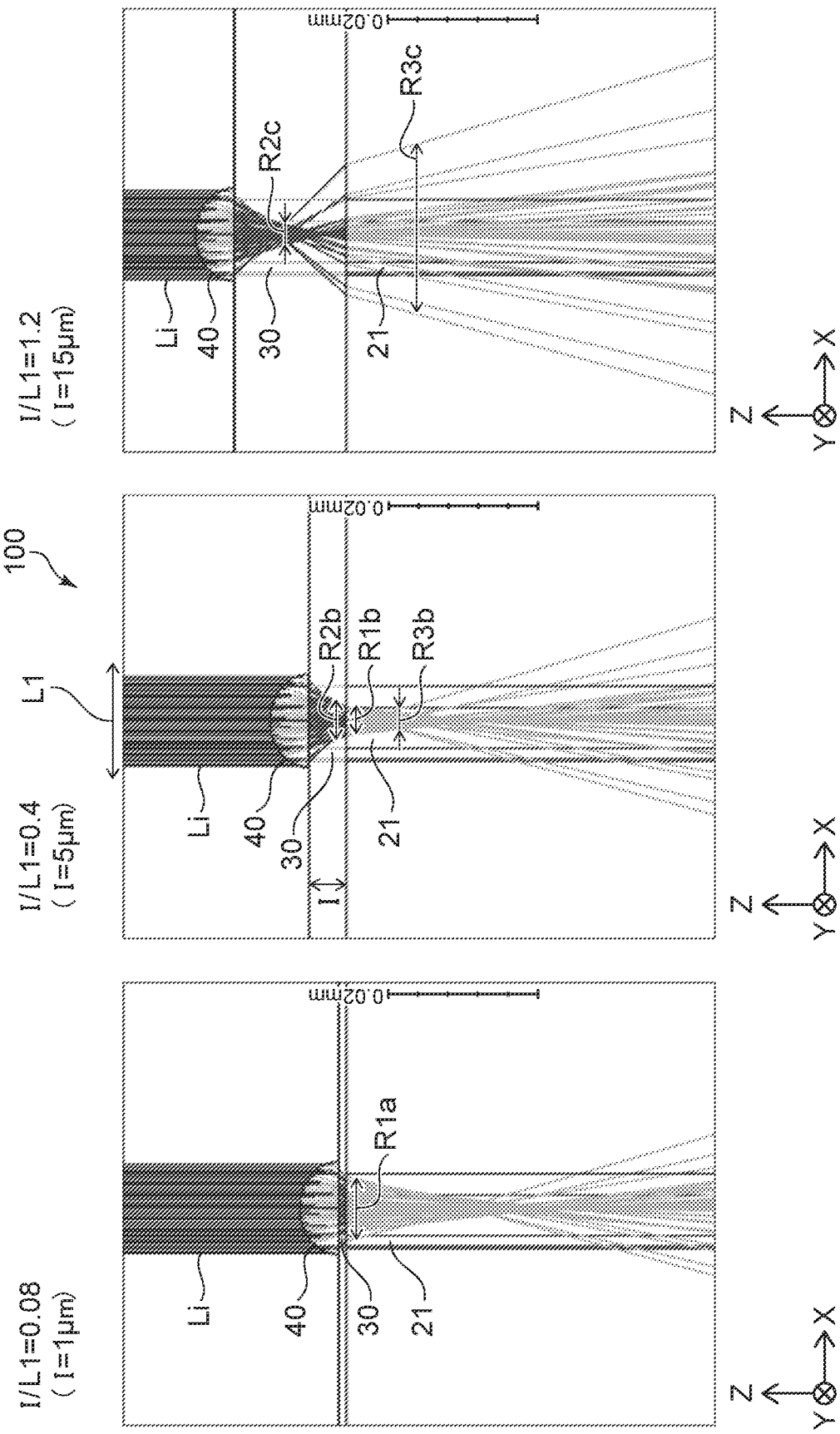
FIGS. 3A to 3C are schematic cross-sectional views illustrating calculation results of the optical path of the light detector.

FIGS. 3A to 3C are schematic cross-sectional views illustrating calculation results of the optical path of the light detector.

In the example illustrated in FIG. 3A, the thickness of the refracting layer is 1 μm, and the thickness of the refracting layer to the period of the elements (I/L1) is 0.08. In the example illustrated in FIG. 3B, the thickness of the refracting layer is 5 μm, and the thickness of the refracting layer to the period of the elements (I/L1) is 0.4. In the example illustrated in FIG. 3C, the thickness of the refracting layer is 15 μm, and the thickness of the refracting layer to the period of the elements (I/L1) is 1.2.

The parameters other than the thickness of the refracting layer are common to the calculations of the optical paths of FIGS. 3A to 3C. The width (the length along the X-axis direction) of the lens 40 is 12.5 μm; the height (the length along the Z-axis direction) of the lens 40 is 5.3 μm; the refractive index of the semiconductor layer 21 is 3.621; the refractive index of the refracting layer 30 is 1.452; and the refractive index of the lens 40 is 1.545. Otherwise, the elements illustrated in FIGS. 3A to 3C are similar to the description relating to FIGS. 2A and 2B.

In the simulation, the wavelength of the light that is incident on the light detector is 900 nm. The lens 40 and the refracting layer 30 control the optical path of the light that is irradiated on the element 10. A light Li (an incident light) that is irradiated on the lens 40 is refracted at the surface of the lens 40 toward the center of the element 10 and passes through the lens 40 and the refracting layer 30. Subsequently, the light Li is re-refracted at the interface between the refracting layer 30 and the semiconductor layer 21 and travels straight through the semiconductor layer 21.

As illustrated in FIGS. 3A to 3C, the optical path of the incident light that passes through the semiconductor layer 21 is changed by modifying the thickness of the refracting layer 30 to the first period L1 (I/L1) even without modifying the lens 40. The characteristics of the element 10 can be improved by the thickness of the refracting layer 30 to the first period L1 (I/L1) because the optical path of the light that passes through the semiconductor layer 21 is changed by the thickness of the refracting layer 30 to the first period L1 (I/L1).

Figure 4:
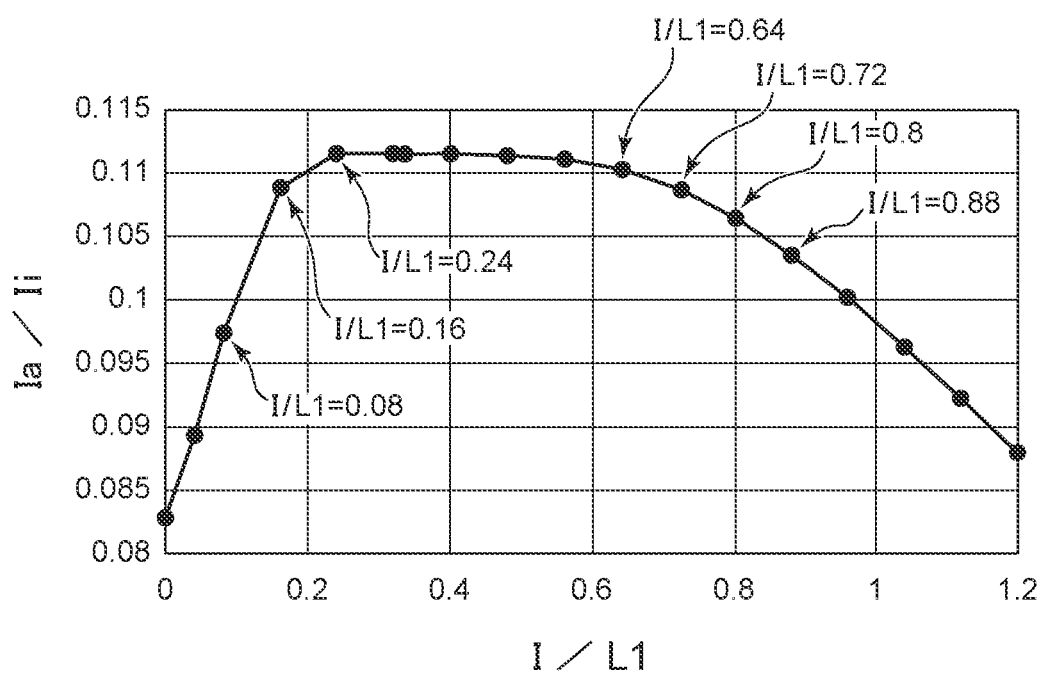
FIG. 4 is a graph illustrating calculation results of the optical absorption efficiency of the light detector.

FIG. 4 is a graph illustrating calculation results of the optical absorption efficiency of the light detector.

FIG. 4 illustrates the calculation results of the optical absorption efficiency when I/L1 is changed by the thickness of the refracting layer in a light detector similar to those of FIGS. 3A to 3C. Here, absorption refers to a phenomenon in which the incident light generates electrons due to photoelectric conversion in the light detector. When evaluating the optical absorption efficiency, first, the region (the avalanche region) that has a likelihood (an avalanche probability) of avalanche multiplication of the carriers generated in the semiconductor layer 21 is calculated. The optical absorption efficiency is evaluated by the ratio of a light intensity Ia absorbed in the avalanche region to a light intensity Ii incident on the light detector (absorbed light intensity/incident light intensity=Ia/Ii). Accordingly, the probability of light being detected in the light detection element increases as the value of Ia/Ii increases. The avalanche region of FIG. 16B that is described below is used as the avalanche region used to calculate the optical absorption efficiency of FIG. 4.

As illustrated in FIG. 4, a high optical absorption efficiency (light detection efficiency) is obtained when the ratio of the first thickness I to the first period L1 (I/L1) is not less than 0.16 and not more than 0.72. In other words, the sensitivity of the light detector 100 can be improved.

By setting the ratio I/L1 to be not less than 0.16 and not more than 0.72, it is considered that the optical path of the light that is incident on the light detector 100 is easily concentrated at the element center. For example, a distribution range R1$b$ of the light that is incident on the semiconductor layer 21 illustrated in FIG. 3B is narrower than a distribution range R1$a$ of the light that is incident on the semiconductor layer 21 illustrated in FIG. 3A. That is, the light that is incident on the semiconductor layer 21 is more concentrated in the element center in FIG. 3B than in FIG. 3A.

For example, the detection probability of the incident light (e.g., the likelihood of avalanche multiplication of the generated carriers) has a distribution in the semiconductor layer 21 of the element 10. In the light detector 100 in which the multiple elements 10 are arranged in the light-receiving surface, the detection probability is high at the center of the element 10 compared to the end portion of the element 10 (the outer perimeter portion when viewed from the Z-axis direction). For example, there are also cases where a separation structure that electrically or optically separates adjacent elements is located at the end portion of the element 10. For example, a trench structure or an impurity concentration distribution of the semiconductor layer 21 are examples of the separation structure. It is considered that a high light detection efficiency is obtained by concentrating the incident light at the element center.

According to the embodiment, it is favorable for the ratio I/L1 to be not less than 0.16. Thereby, for example, the optical path can easily pass through the center of the element 10 at which the detection probability of the light is high. For example, the refracting layer 30 may be thicker than the lens 40. The optical path length of a portion of the incident light in the refracting layer 30 may be greater than the optical path length of the portion of the incident light in the lens 40.

On the other hand, the light detection efficiency decreases as the ratio I/L1 exceeds 0.72. When the ratio I/L1 is large, the light that is incident on the light detector 100 easily converges in the refracting layer 30 before being incident on the semiconductor layer 21. For example, a distribution range R2c of the light in the refracting layer 30 illustrated in FIG. 3C is narrower than a distribution range R2b of the light in the refracting layer 30 illustrated in FIG. 3B. When the light converges in the refracting layer 30, the light that is in the semiconductor layer 21 travels toward the outer side of the element 10. For example, a distribution range R3c of the light in the semiconductor layer 21 illustrated in FIG. 3C is wider than a distribution range R3b of the light in the semiconductor layer 21 illustrated in FIG. 3B. When the light that is in the semiconductor layer 21 travels toward the outer side of the element 10, the light does not easily pass through the element center at which the detection probability is high in the semiconductor layer 21.

According to the embodiment, it is favorable for the ratio I/L1 to be not more than 0.72. Thereby, for example, the optical path can easily pass through the center of the element 10 at which the detection probability of the light is high. From the perspective of the material cost and the strain due to the stress of the refracting layer 30 as well, it is favorable for the refracting layer 30 not to be too thick. For example, it is favorable for the first thickness I of the refracting layer 30 to be not less than 2 μm and not more than 8 μm.

The thickness (the length along the Z-axis direction) of the semiconductor layer 21 (the first semiconductor region 11) is taken as a second thickness T (referring to FIG. 2A). It is favorable for the ratio of the second thickness T to the first period L1 (second thickness/first period=T/L1) to be not less than 0.4. For example, the ratio T/L1 is set to be not less than 0.4 by reducing the first period L1. The resolution of the light detector 100 can be improved by reducing the first period L1. Also, for example, the ratio T/L1 may be set to be not less than 0.4 by increasing the second thickness T. By making the semiconductor layer 21 thick, the optical path length in the semiconductor layer 21 can be ensured, and the detection probability of the light can be increased.

On the other hand, when the first period L1 is too short, there is a risk that the proportion of the element end portion (outer perimeter portion) in the light-receiving surface of the element 10 may become large, and the light that passes through the element center at which the light detection probability is high may decrease. Conversely, it is favorable for the ratio T/L1 of the second thickness T to the first period L1 to be not more than 1.2. In such a case, the first period L1 can be prevented from being too short, and the reduction of the light passing through the element center can be suppressed. For example, it is favorable for the first period L1 to be not less than 10 μm and not more than 15 μm.

When the first period L1 is relatively short, it is more favorable for the ratio I/L1 of the first thickness I to the first period L1 to be not less than 0.16 and not more than 0.72. Thereby, even when the first period L1 is relatively short and the proportion of the element end portion is relatively large, the light can easily pass through the element center; and the reduction of the light that passes through the element center can be suppressed.

According to embodiments as described above, for example, both a smaller surface area and high sensitivity of the light-receiving element are realized.

Figure 5A:
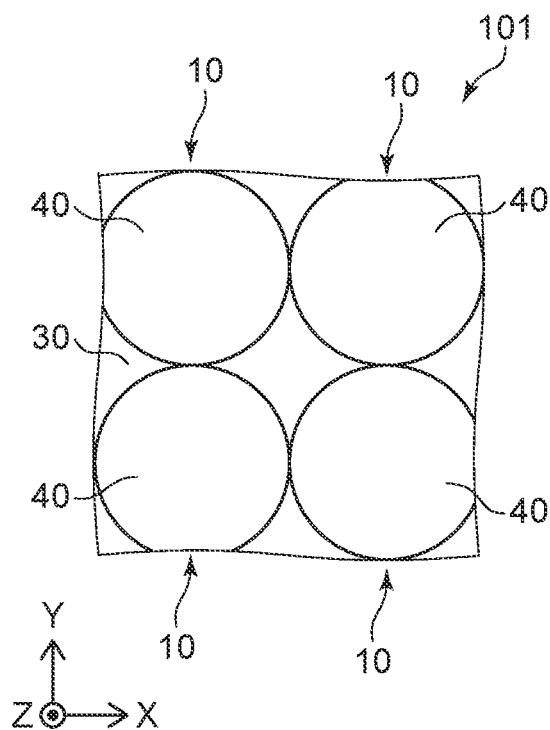
FIGS. 5A and 5B are schematic plan views illustrating portions of other light detectors according to the first embodiment.
Figure 5B:
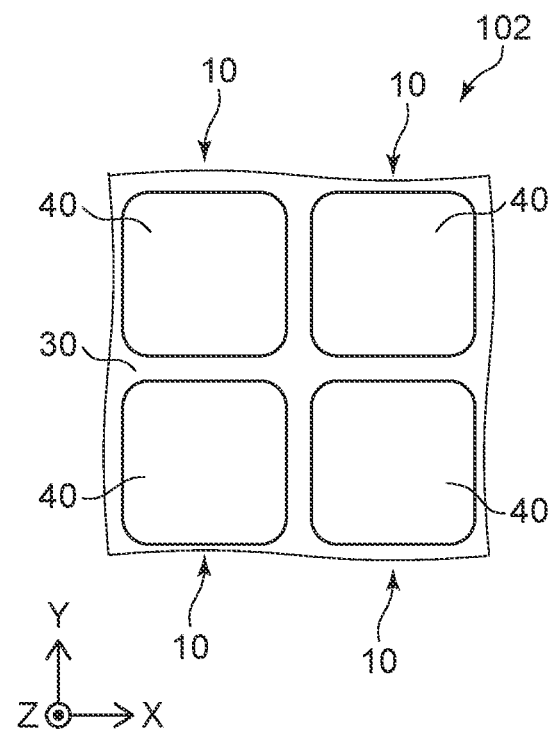

FIGS. 5A and 5B are schematic plan views illustrating portions of other light detectors according to the first embodiment.

FIG. 5A illustrates a portion of a light detector 101 according to a modification of the first embodiment. Thus, among the multiple lenses 40, the adjacent lenses 40 may contact each other. Also, portions of the adjacent lenses 40 may overlap each other.

FIG. 5B illustrates a portion of a light detector 102 according to a modification of the first embodiment. In the example, the shape of the lens 40 is a rectangle in which the corners have curvature when viewed from the Z-axis direction. When viewed from the Z-axis direction, the shape of the lens 40 may not be circular, and may be substantially a polygon or a rounded polygon.

Figure 6:
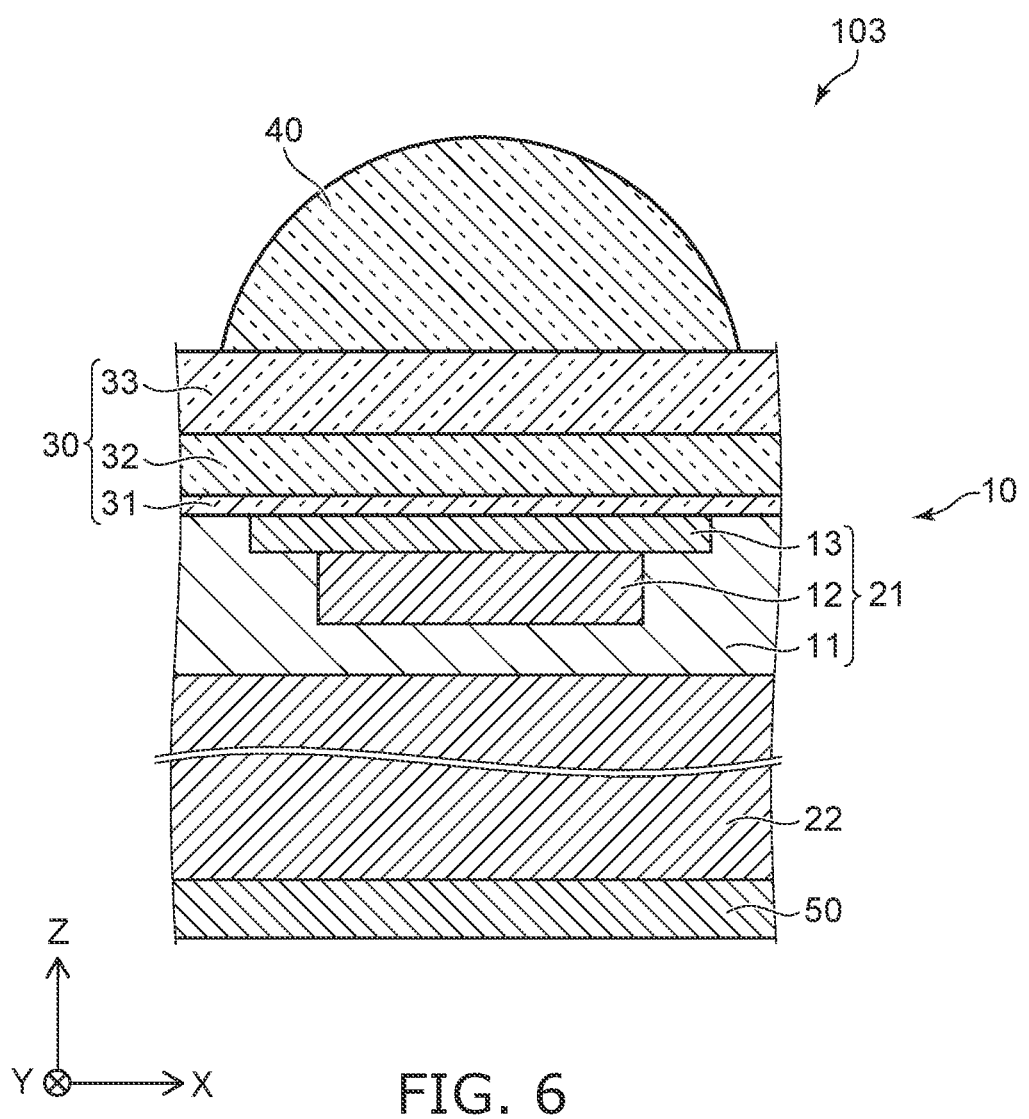
FIG. 6 is a cross-sectional view illustrating a portion of another light detector according to the first embodiment.

FIG. 6 is a cross-sectional view illustrating a portion of another light detector according to the first embodiment.

Similarly to FIG. 2A, FIG. 6 illustrates a portion of a light detector 103 according to a modification of the first embodiment. In the light detector 103, the refracting layer 30 has a stacked structure that includes multiple layers. Otherwise, a description similar to that of the light detector 100 is applicable to the light detector 103. The conductive part 61, the quenching part 63, and the first interconnect 51 are not illustrated in FIG. 6.

In the example, the refracting layer 30 includes a first layer 31, a second layer 32, and a third layer 33. The first layer 31 is located between the multiple lenses 40 and the multiple elements 10. The second layer 32 is located between the first layer 31 and the multiple lenses 40. The third layer 33 is located between the second layer 32 and the multiple lenses 40. The stacked structure is not always limited to three layers and may be two layers, four layers, or more.

The thicknesses of the first to third layers 31 to 33 may be the same or different from each other. The refractive indexes of the first to third layers 31 to 33 may be the same or different from each other. The refractive indexes of the first to third layers 31 to 33 each are, for example, not less than 1.4 and not more than 2. For example, the first to third layers 31 to 33 each include silicon and one selected from the group consisting of oxygen and nitrogen. For example, the first to third layers 31 to 33 each include at least one of silicon oxide, silicon nitride, or a resin.

The refracting layer 30 may perform a role other than the optical path control of the incident light described above. For example, the refracting layer 30 may include the role of a stopper in a manufacturing process (e.g., etching polishing, etc.) of the light detector, the role of protecting electrodes (e.g., the conductive part 61) from contacting the outside and short-circuiting, etc. In such a case, the refracting layer 30 may be made by stacking insulating layers according to the roles. For example, the first layer 31 may be a silicon oxide film that protects the surface of the semiconductor layer 21; the second layer 32 may be a silicon nitride film that is a stopper layer in a process; and the third layer 33 may be a silicon oxide film that protects an electrode.

Second Embodiment

Figure 7:
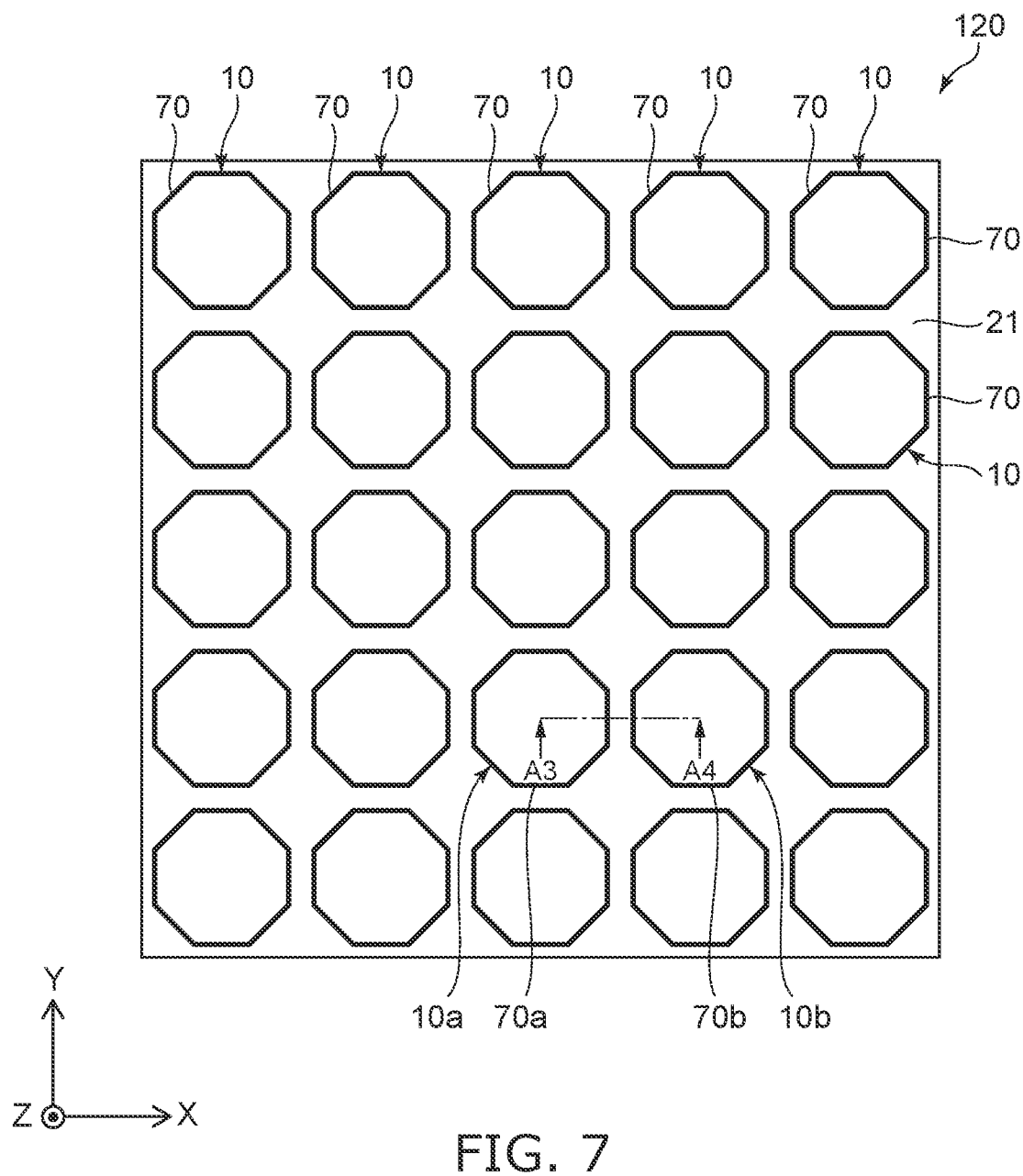
FIG. 7 is a plan view illustrating a light detector according to a second embodiment.

FIG. 7 is a plan view illustrating a light detector according to a second embodiment.

As illustrated in FIG. 7, the light detector 120 according to the second embodiment includes multiple structure bodies 70. For example, the structure body 70 is a trench part that is located in the semiconductor layer 21. Otherwise, a description similar to that of the light detector 100 according to the first embodiment is applicable to the light detector 120. The refracting layer 30, the multiple lenses 40, the conductive part 61, the quenching part 63, etc., are not illustrated in FIG. 7.

In the example, the structure body 70 is substantially octagonal when viewed along the Z-axis direction. The multiple structure bodies 70 respectively surround the multiple elements 10 along the X-Y plane. Therefore, the multiple structure bodies 70 are arranged to match the period of the multiple elements 10. For example, the multiple structure bodies 70 include a first structure body 70a and a second structure body 70b. The first structure body 70a surrounds the first element 10a. The second structure body 70b surrounds the second element 10b.

Herein, "surround" includes not only the case where an unbroken component continuously surrounds another component, but also the case where multiple components are separated from each other and arranged around the other component. For example, the other component can be considered to be surrounded with the multiple components when the other component is positioned inside a path obtained by tracing along the multiple components.

The first structure body 70a and the second structure body 70b each are octagonal when viewed from the Z-axis direction. Here, an octagon may be a rounded octagon. In one structure body 70 of the example, the length in the X-axis direction and the length in the Y-axis direction are substantially the same. In the example, when viewed from the Z-axis direction, the shapes of the multiple structure bodies 70 are substantially the same. The period of the arrangement of the multiple structure bodies 70 may be substantially equal to the period of the arrangement of the multiple elements 10 (the first period L1 and the second period L2).

Figure 8:
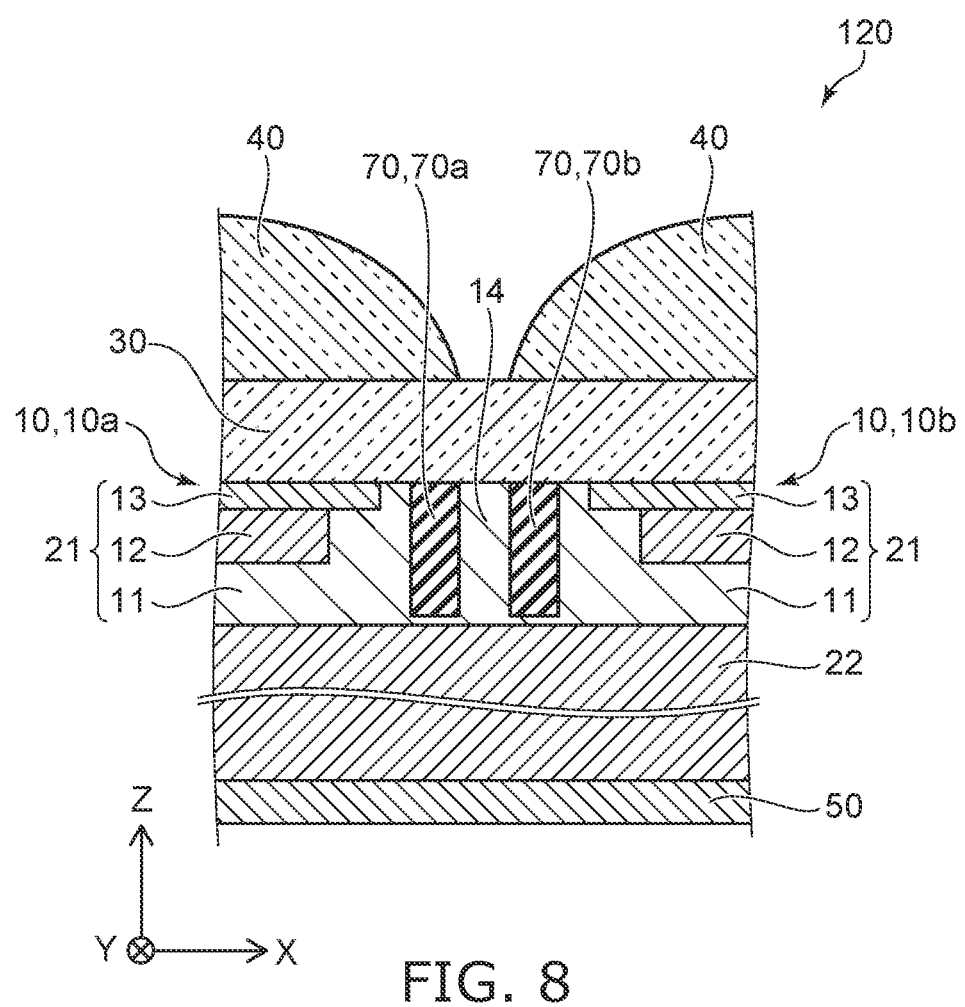
FIG. 8 is a schematic cross-sectional view illustrating a portion of the light detector according to the second embodiment.

FIG. 8 is a schematic cross-sectional view illustrating a portion of the light detector according to the second embodiment.

FIG. 8 shows a line A3-A4 cross section shown in FIG. 7. As illustrated in FIG. 8, at least a portion of the structure body 70 is located in the semiconductor layer 21.

In the example, the level of the upper end of the structure body 70 is substantially equal to the level of the upper surface of the semiconductor layer 21 (the light-receiving surface). The upper surface of the structure body 70 may contact the refracting layer 30. In the example, the structure body 70 does not reach the semiconductor layer 22; and the lower end of the structure body 70 is higher than the lower surface of the semiconductor layer 21. At least a portion of the structure body 70 is arranged with the first to third semiconductor regions 13 in a direction perpendicular to the Z-axis direction.

The second semiconductor region 12 and the third semiconductor region 13 do not contact the structure body 70. A portion of the first semiconductor region 11 is positioned between the second semiconductor region 12 and the structure body 70 and contacts the second semiconductor region 12 and the structure body 70. Another portion of the first semiconductor region 11 is positioned between the third semiconductor region 13 and the structure body 70 and contacts the third semiconductor region 13 and the structure body 70. However, the second semiconductor region 12 and the third semiconductor region 13 may contact the structure body 70.

The refractive index of the structure body 70 is different from the refractive index of the semiconductor layer 21. The refractive index of the structure body 70 is different from the refractive indexes of the first to third semiconductor regions 13. The structure body 70 is insulative. The structure body 70 is provided to suppress the conduction and optical interference between the elements 10. The movement of secondary photons and carriers between the elements 10 is suppressed by the structure body 70. When secondary photons are generated by light being incident on the element 10, the secondary photons that travel toward the adjacent elements 10 are reflected and refracted at the interface of the structure body 70. By providing the structure body 70, crosstalk noise can be reduced.

For example, at least a portion of the first structure body 70a is located between the first semiconductor region 11 of the first element 10a and the first semiconductor region 11 of the second element 10b. The movement of the secondary photons and the carriers between the first element 10a and the second element 10b can be suppressed thereby.

The multiple structure bodies 70 are provided independently for each element. In other words, the multiple structure bodies 70 are separated and do not physically contact each other. For example, at least a portion of the second structure body 70b is located between the first semiconductor region 11 of the second element 10b and at least a portion of the first structure body 70a. The first structure body 70a and the second structure body 70b are separated from each other. Thereby, for example, compared to when one separation structure is located between the adjacent elements 10, the number of interfaces of the structure body 70 between the adjacent elements 10 is increased. By increasing the number of interfaces, when secondary photons are generated in the element 10, the secondary photons that travel toward the adjacent elements 10 are more easily reflected. Crosstalk noise can be further reduced thereby. A semiconductor region 14 (e.g., a portion of the semiconductor layer 21) may be located between the first structure body 70a and the second structure body 70b. The semiconductor region 14 contacts the first and second structure bodies 70a and 70b. For example, the semiconductor region 14 extends in the Y-axis direction between the structure bodies 70 that are adjacent in the X-axis direction. The semiconductor region 14 extends in the X-axis direction between the structure bodies 70 that are adjacent in the Y-axis direction.

The structure body 70 includes an insulating material. For example, the structure body 70 includes silicon and one selected from the group consisting of oxygen and nitrogen. For example, the structure body 70 includes silicon oxide or silicon nitride. The structure body 70 may have a stacked structure.

When the structure body 70 is provided, for example, there are cases where defects that are caused by a thermal expansion coefficient difference occur at the interface between the element 10 and the structure body 70. For example, crystal defects occur in the semiconductor layer 21 at the end portion (the outer perimeter portion) of the element 10. There are cases where such defects cause noise. For example, there is a possibility that carriers that are generated in the defects may cause avalanche multiplication in the semiconductor layer 21.

In the light detector 120 as well, for example, the ratio of the first thickness I to the first period L1 is not less than 0.16 and not more than 0.72. Thereby, similarly to the first embodiment, the optical path more easily passes through the element center at which the detection probability of the light is high. The regions through which much of the light passes can be separated from the element end portion at which crystal defects easily occur. For example, by reducing the avalanche probability at the element end portion, a high light detection efficiency can be obtained while suppressing the noise.

FIGS. 9A to 9D are schematic plan views illustrating portions of other light detectors according to the second embodiment.

FIG. 9A, FIG. 9B, FIG. 9C, and FIG. 9D illustrate portions of light detectors 121, 122, 123, and 124 according to modifications of the second embodiment. Compared to the light detector 120 illustrated in FIG. 7, the shapes of the structure bodies 70 of the light detectors 121, 122, 123, and 124 are different. Otherwise, a description similar to that of the light detector 120 is applicable to the light detectors 121, 122, 123, and 124.

Figure 9A:
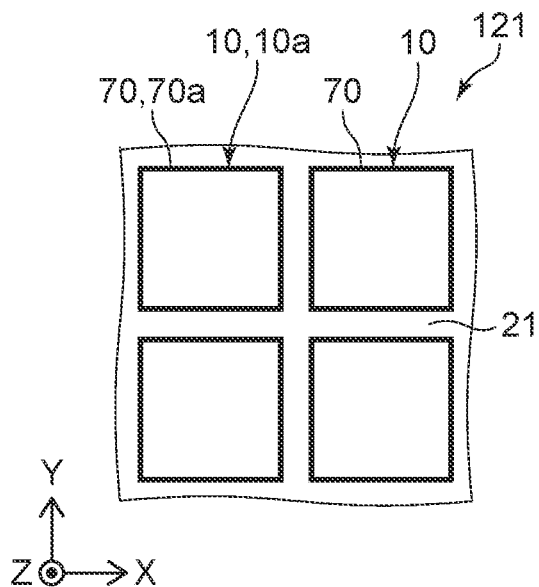
FIGS. 9A to 9D are schematic plan views illustrating portions of other light detectors according to the second embodiment.

As in the light detector 121 illustrated in FIG. 9A, the structure body 70 may be rectangular when viewed from the Z-axis direction. The shape of the structure body 70 may be a polygon or a rounded polygon when viewed from the Z-axis direction.

Figure 9B:
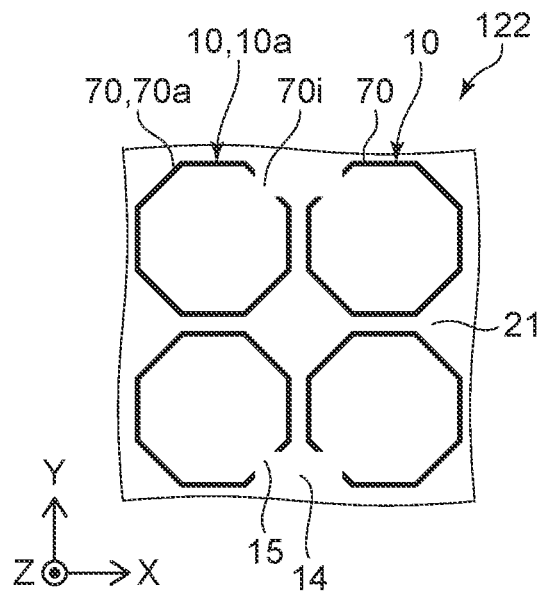
Figure 9C:
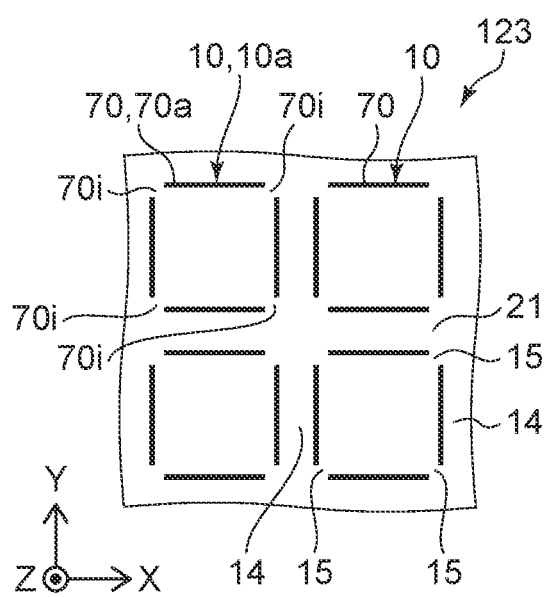
Figure 9D:
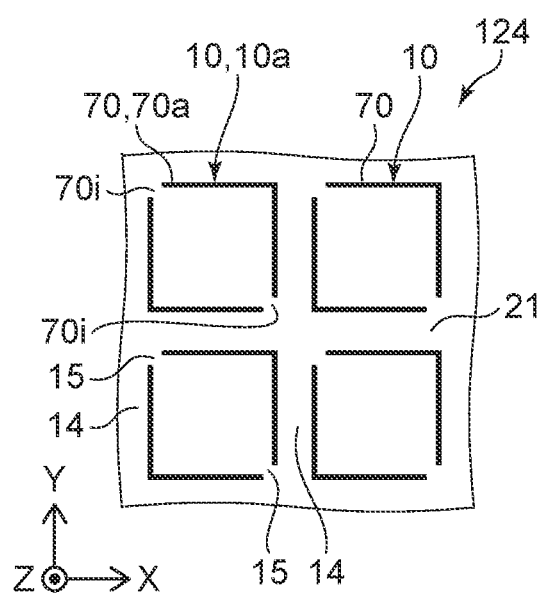

As illustrated in FIGS. 9B to 9D, the structure body 70 discontinuously surrounds the element 10 when viewed from the Z-axis direction. In other words, the structure body 70 may not have a perfectly ring-shaped structure when viewed from the Z-axis direction, and may have a shape in which a portion is open. Interference between the conductive part 61 and the structure body 70 can be suppressed thereby. For example, a portion of the conductive part 61 may be located at the discontinuous section of the structure body 70. By changing the shape of the structure body 70, the arrangement of the conductive part 61, the quenching part 63, the first interconnect 51, etc., is easy.

In the light detector 122 illustrated in FIG. 9B, a substantially octagonal structure body 70 surrounds the element 10 when viewed from the Z-axis direction. The planar shape of the structure body 70 includes one opening 70i (a section where the ring shape is discontinuous) that is located in one side of the octagon.

In the light detector 123 illustrated in FIG. 9C, a substantially rectangular structure body 70 surrounds the element 10 when viewed from the Z-axis direction. The planar shape of the structure body 70 includes a total of four openings 70i located at the corners of the rectangle.

In the light detector 124 illustrated in FIG. 9D, a substantially rectangular structure body 70 surrounds the element 10 when viewed from the Z-axis direction. The planar shape of the structure body 70 includes a total of two openings 70i located at opposite corners of the rectangle.

As illustrated in FIGS. 9B to 9D, the semiconductor layer 21 includes a semiconductor region 15 that is positioned in the opening 70i when viewed from the Z-axis direction. The element inside the structure body 70 is continuous with the semiconductor region 14 outside the structure body 70 via the semiconductor region 15.

Figure 10A:
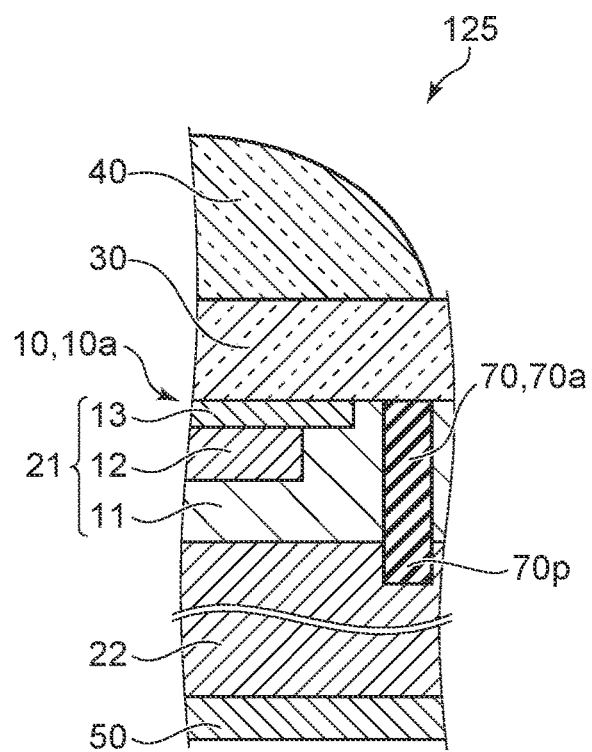
FIGS. 10A and 10B are schematic cross-sectional views illustrating portions of other light detectors according to the second embodiment.
Figure 10B:
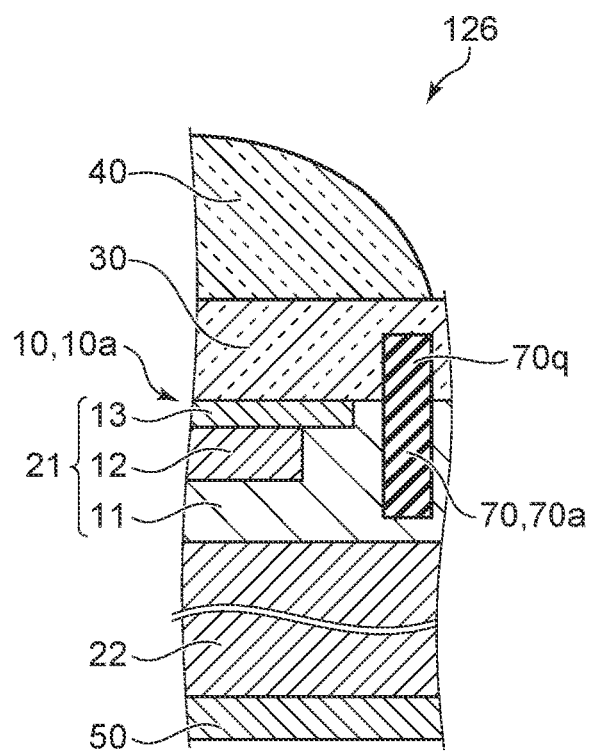

FIGS. 10A and 10B are schematic cross-sectional views illustrating portions of other light detectors according to the second embodiment.

Similarly to FIG. 8, FIGS. 10A and 10B illustrate portions of light detectors 125 and 126 according to modifications of the second embodiment. Compared to the light detector 120 illustrated in FIG. 8, the arrangements of the structure bodies 70 of the light detectors 125 and 126 are different. Otherwise, a description similar to that of the light detector 120 is applicable to the light detectors 125 and 126.

For example, the depth of the structure body 70 can be modified according to the manufacturing processes and/or the characteristics of the element 10. For example, as illustrated in FIG. 10A, the structure body 70 may extend through the semiconductor layer 21 and extend to the semiconductor layer 22. In other words, the lower end of the structure body 70 may be lower than the lower surface of the semiconductor layer 21. A lower portion 70p of the structure body 70 may be surrounded with the semiconductor layer 22 in the X-Y plane. The lower portion 70p of the structure body 70 may physically contact the semiconductor layer 22.

As illustrated in FIG. 10B, the structure body 70 may extend into the refracting layer 30. In other words, the upper end of the structure body 70 may be higher than the upper surface of the semiconductor layer 21. An upper portion 70q of the structure body 70 may be surrounded with the refracting layer 30 in the X-Y plane.

Because the structure body 70 extends into the refracting layer 30 or into the semiconductor layer 21, the crosstalk between elements can be further suppressed.

Figure 11:
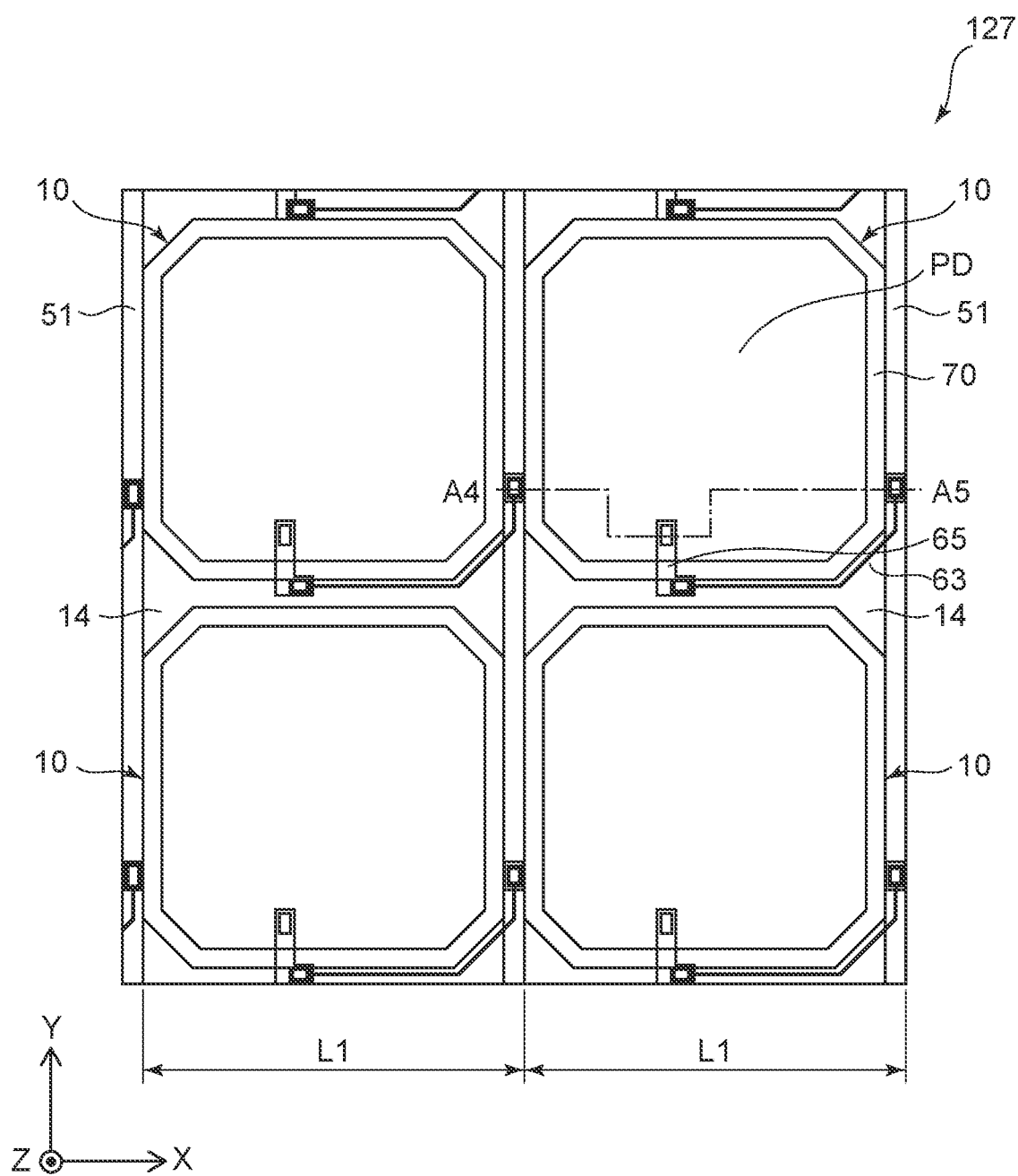
FIG. 11 is a schematic plan view illustrating a portion of a light detector according to the second embodiment.

FIG. 11 is a schematic plan view illustrating a portion of a light detector according to the second embodiment.

Figure 12:
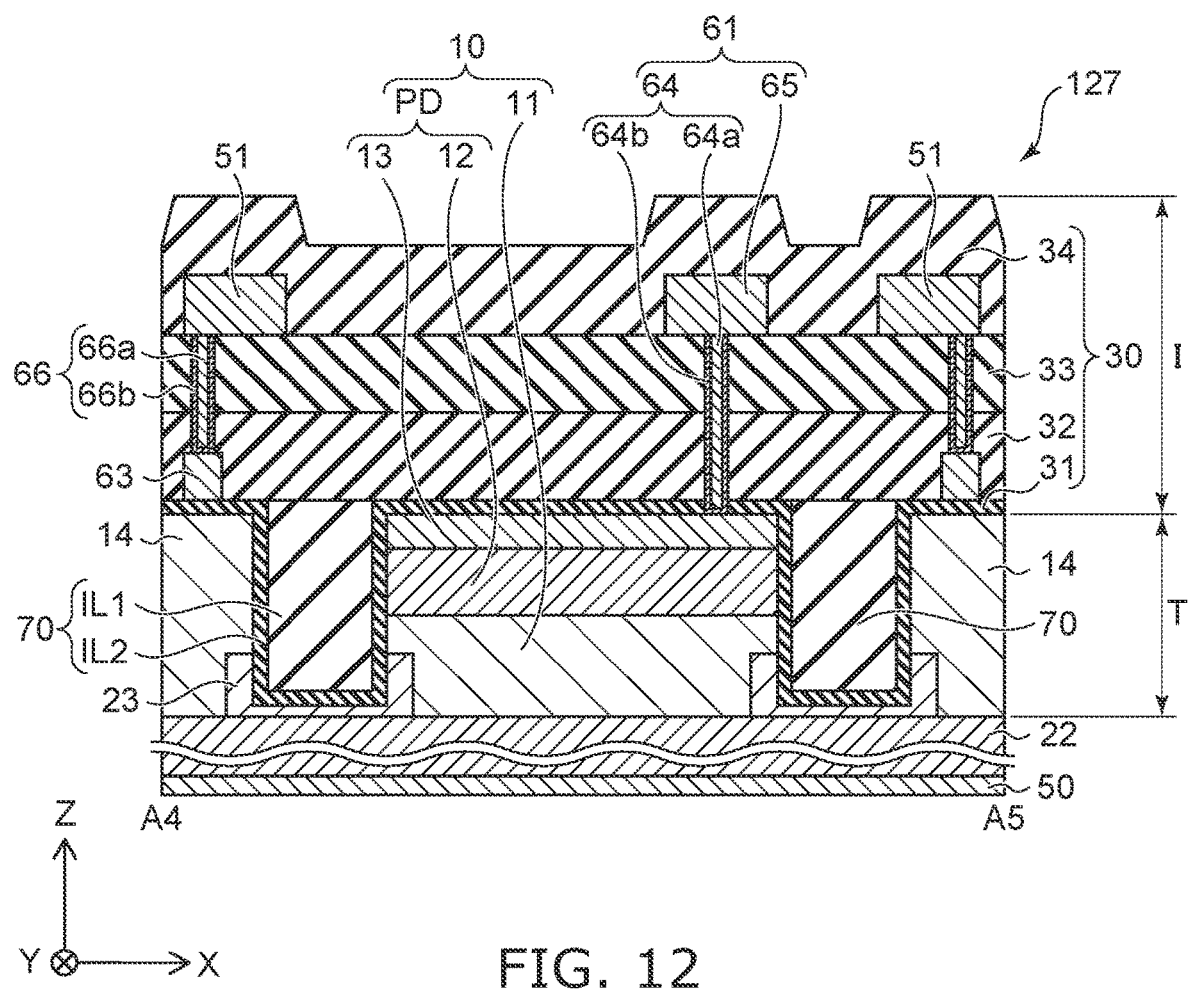
FIG. 12 is a schematic cross-sectional view illustrating a portion of the light detector according to the second embodiment.

FIG. 12 is a schematic cross-sectional view illustrating a portion of the light detector according to the second embodiment.

These drawings illustrate the light detector 127 according to a modification of the second embodiment. The lens 40 and the refracting layer 30 are not illustrated in FIG. 11. FIG. 12 shows an A4-A5 cross section of FIG. 11.

As illustrated in FIG. 12, the structure body 70 may include a first insulating layer IL1 and a second insulating layer IL2. The second insulating layer IL2 is located between the first insulating layer IL1 and the element 10 and between the first insulating layer IL1 and the semiconductor layer 22. For example, the first insulating layer IL1 and the second insulating layer IL2 include silicon oxide; and the second insulating layer IL2 has a dense structure compared to the first insulating layer IL1.

As illustrated in FIG. 12, a p-type semiconductor region 23 may be located between the semiconductor layer 22 and the structure body 70 in the Z-axis direction. The p-type impurity concentration in the semiconductor region 23 is greater than the p-type impurity concentration in the first semiconductor region 11.

In the example, a quenching resistance is electrically connected to each element 10 as the quenching part 63. For example, when viewed from the Z-axis direction, the quenching part 63 exists at a different position from a photodiode PD. For example, the quenching part 63 is arranged with the structure body 70 or the semiconductor region 14 in the Z-axis direction. Another end of the quenching part 63 is electrically connected with the first interconnect 51.

The multiple conductive parts 61 are connected respectively to the multiple elements 10. The multiple conductive parts 61 each include a contact 64 and a connection interconnect 65. The quenching part 63 is electrically connected with the third semiconductor region 13 via the contact 64 and the connection interconnect 65 and is electrically connected with the first interconnect 51 via a contact 66.

The contacts 64 and 66 include a metal material. For example, the contacts 64 and 66 include at least one selected from the group consisting of titanium, tungsten, copper, and aluminum. The contacts 64 and 66 may include a conductor that is made of a silicon compound or a nitride of at least one selected from the group consisting of titanium, tungsten, copper, and aluminum. As shown in FIG. 12, the contact 64 may include a metal layer 64a and a metal layer 64b. The contact 66 may include a metal layer 66a and a metal layer 66b. The metal layer 64b is located between the metal layer 64a and the first layer 31, between the metal layer 64a and the second layer 32, and between the metal layer 64a and the third layer 33. The metal layer 66b is located between the metal layer 66a and the second layer 32 and between the metal layer 66a and the third layer 33. For example, the metal layers 64a and 66a include tungsten. The metal layers 64b and 66b include titanium. The metal layer 64b may include a titanium layer and a titanium nitride layer that is located between the titanium layer and the metal layer 64a. The metal layer 66b may include a titanium layer and a titanium nitride layer that is located between the titanium layer and the metal layer 66a. The connection interconnect 65 includes at least one selected from the group consisting of copper and aluminum.

For example, the position in the Z-axis direction of the quenching part 63 is between the position in the Z-axis direction of the third semiconductor region 13 and the position in the Z-axis direction of the first interconnect 51. One first interconnect 51 is electrically connected with multiple photodiodes PD arranged in the Y-axis direction.

The electrical resistance of the quenching part 63 is greater than the electrical resistances of the contact 64, the contact 66, and the connection interconnect 65. The quenching resistance includes polysilicon as a semiconductor material. An n-type impurity or a p-type impurity may be added to the quenching resistance.

For example, the refracting layer 30 includes the first to fourth layers 31 to 34. The first to third layers 31 to 33 are located between the fourth layer 34 and the multiple elements 10 in the Z-axis direction. The first layer 31 and the second layer 32 are located between the third layer 33 and the multiple elements 10 in the Z-axis direction. The first layer 31 is located between the second layer 32 and the multiple elements 10 in the Z-axis direction.

The contacts 64 and 66 are surrounded with the first to third layers 31 to 33 along the X-Y plane. A portion of the first layer 31 is located between the semiconductor region 14 and the quenching part 63 in the Z-axis direction. The first interconnect 51 and the connection interconnect 65 are surrounded with the fourth layer 34.

The p-type impurity concentration in the first semiconductor region 11 is, for example, not less than $1.0 \times 10^{13}$ atoms/cm$^3$ and not more than $1.0 \times 10^{16}$ atoms/cm$^3$. By setting this concentration range, the depletion layer can sufficiently spread in the first semiconductor region 11; and the photon detection efficiency or the light-receiving sensitivity can be increased.

The p-type impurity concentration in the second semiconductor region 12 is, for example, not less than $1.0 \times 10^{16}$ atoms/cm$^3$ and not more than $1.0 \times 10^{18}$ atoms/cm$^3$. By setting this concentration range, the second semiconductor region 12 can have a p-n junction with the third semiconductor region 13; and a depletion layer can easily spread in the second semiconductor region 12.

The n-type impurity concentration in the third semiconductor region 13 is, for example, not less than $1.0 \times 10^{18}$ atoms/cm$^3$ and not more than $1.0 \times 10^{21}$ atoms/cm$^3$. By setting this concentration range, the electrical resistance in the third semiconductor region 13 can be reduced, and the loss of the carriers in the second semiconductor region 12 can be reduced.

The p-type impurity concentration in the semiconductor layer 22 is not less than $1.0 \times 10^{17}$ atoms/cm$^3$ and not more than $1.0 \times 10^{21}$ atoms/cm$^3$. A conductive layer that includes a metal may be used instead of the semiconductor layer 22. For example, a conductive layer that includes at least one selected from the group consisting of aluminum, copper, titanium, gold, and nickel is used.

Figure 13:
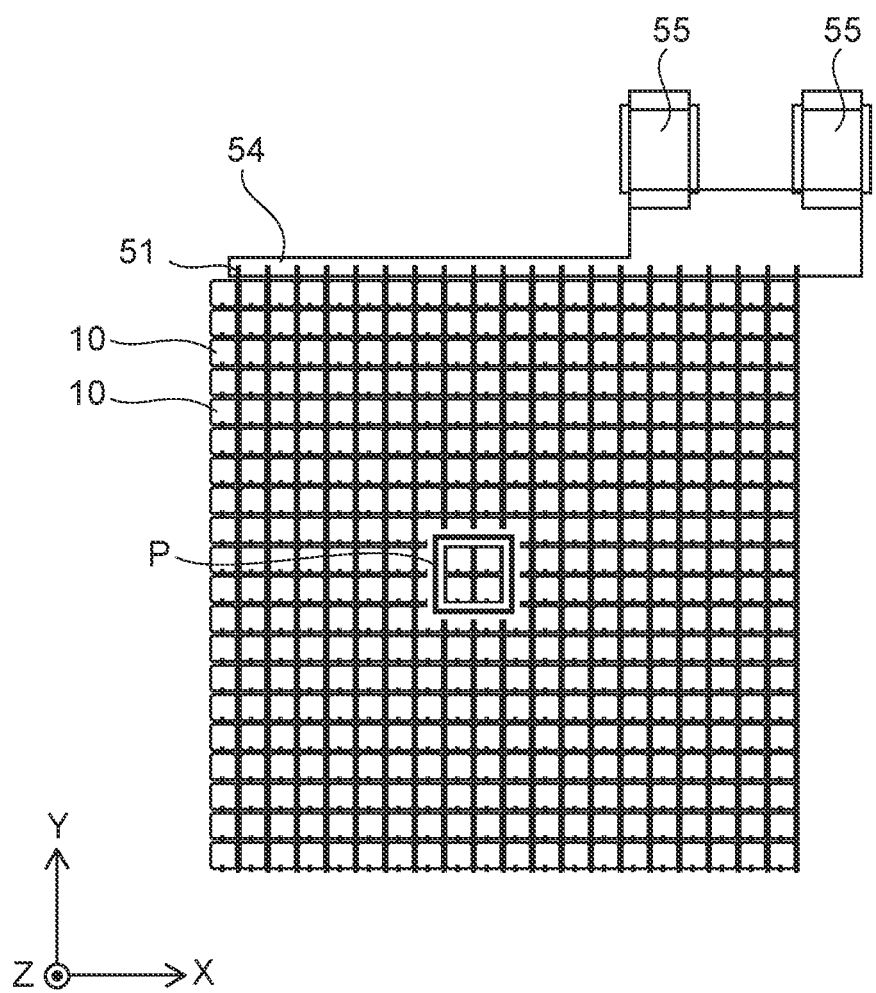
FIG. 13 is a schematic plan view illustrating a portion of the light detector according to the second embodiment.

FIG. 13 is a schematic plan view illustrating a portion of the light detector according to the second embodiment.

As shown in FIG. 13, the light detector 127 further includes a common interconnect 54 and a pad 55. FIG. 11 shows portion P shown in FIG. 13. One first interconnect 51 is electrically connected to multiple elements 10 arranged in the Y-axis direction. Multiple first interconnects 51 that are arranged in the X-axis direction are electrically connected with the common interconnect 54. The common interconnect 54 is electrically connected with not less than one pad 55. An interconnect of an external device is electrically connected to the pad 55.

Figure 14:
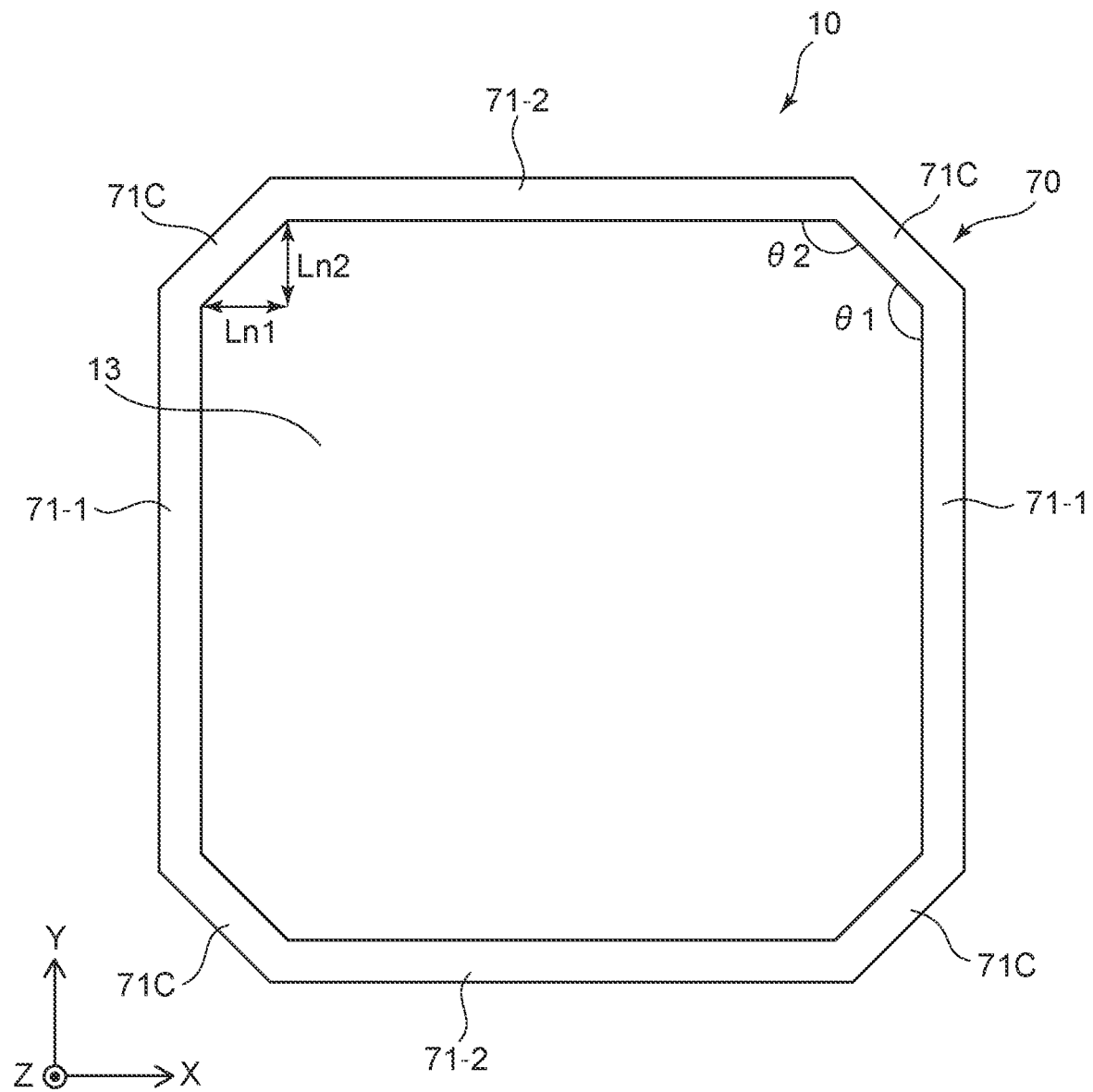
FIG. 14 is a plan view illustrating a portion of the light detector according to the second embodiment.
Figure 15:
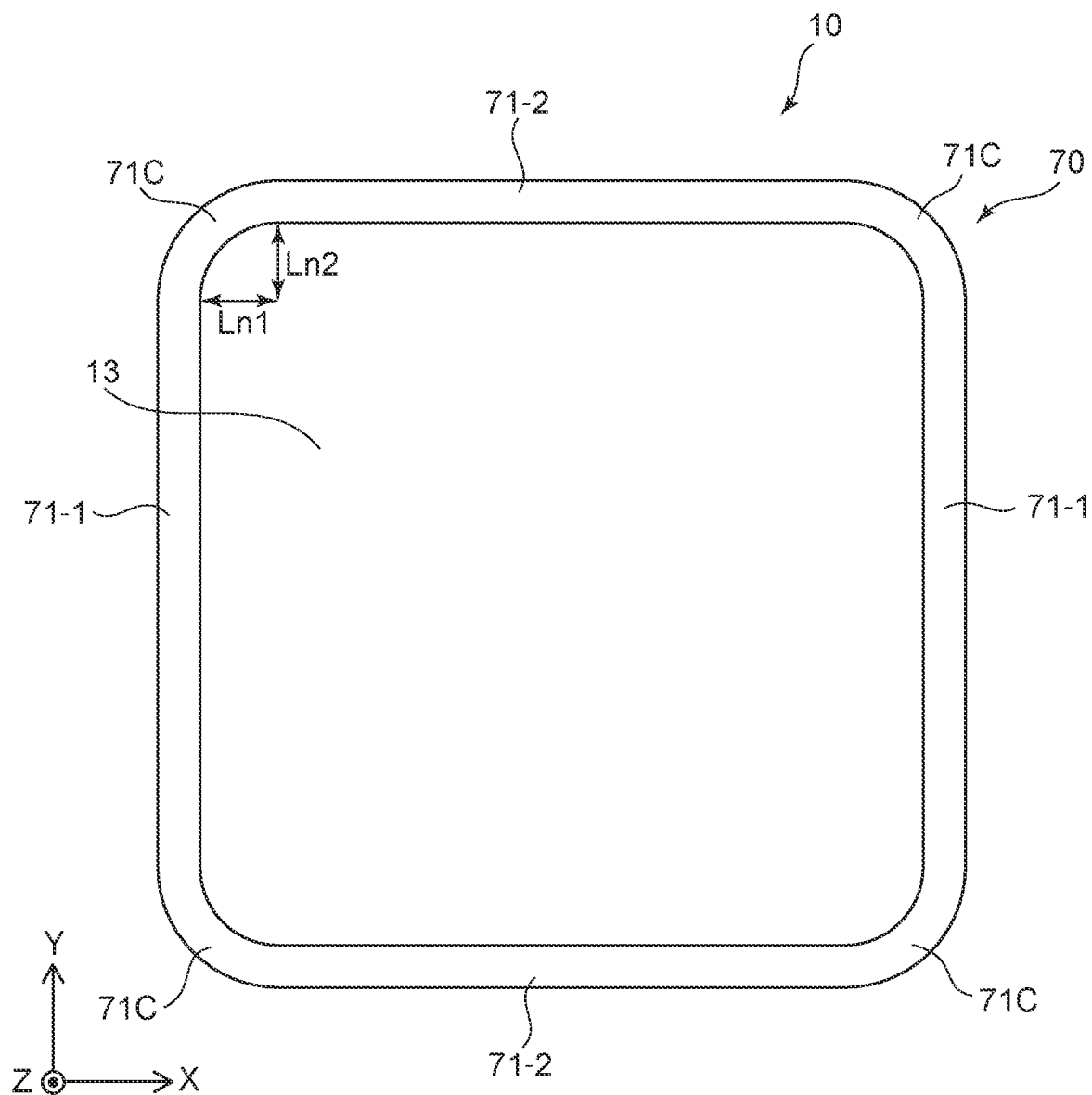
FIG. 15 is a plan view illustrating a portion of the light detector according to the second embodiment.

FIGS. 14 and 15 are plan views illustrating portions of the light detector according to the second embodiment.

As shown in FIG. 14, the structure body 70 is a five-or-higher-sided polygon when viewed from the Z-axis direction. In the example of FIG. 14, the structure body 70 is octagonal when viewed from the Z-axis direction. For example, the structure body 70 may include a pair of first extension portions 71-1 that extend in the Y-axis direction, a pair of second extension portions 71-2 that extend in the X-axis direction, and multiple couplers 71C. The first to third semiconductor regions 11 to 13 (the photodiode PD) are located between the pair of first extension portions 71-1 in the X-axis direction. The first to third semiconductor regions 11 to 13 are located between the pair of second extension portions 71-2 in the Y-axis direction. Each coupler 71C links one end of the first extension portion 71-1 and one end of the second extension portion 71-2.

According to such a structure, the angles of the corners of the structure body 70 can be increased, and the stress can be relaxed at the corners of the structure body 70. For example, by relaxing the stress, the occurrence of cracks in the semiconductor region 14 can be suppressed, and operation errors that are caused by the occurrence of cracks can be suppressed. Also, when a crack occurs in a semiconductor layer when forming the structure body 70, there is a possibility that the resist may enter the crack in a subsequent photolithography process. When the resist enters the crack, residue of the resist may remain in the crack when the resist is stripped away. The residue of the resist causes organic contamination of an oxidation furnace in a subsequent heating process such as oxidization. These problems can be solved by relaxing the stress at the corners of the structure body 70.

The length in the Y-axis direction of the first extension portion 71-1 is greater than the length in the Y-axis direction of the coupler 71C. The length in the X-axis direction of the second extension portion 71-2 is greater than the length in the X-axis direction of the coupler 71C. For example, when viewed from the Z-axis direction, the coupler 71C has a straight-line shape; and the structure body 70 is octagonal. When viewed from the Z-axis direction, it is favorable for the shape of the structure body 70 to have eight or more sides. In other words, it is favorable for an angle θ1 between the first extension portion 71-1 and the coupler 71C to be not less than 135 degrees. It is favorable for an angle θ2 between the second extension portion 71-2 and the coupler 71C to be not less than 135 degrees. The exterior angle between the first extension portion 71-1 and the coupler 71C and the exterior angle between the second extension portion 71-2 and the coupler 71C can be increased thereby. By increasing these exterior angles, the stress can be relaxed at the corners of the structure body 70.

It is favorable for a length Ln1 in the X-axis direction of the coupler 71C and a length Ln2 in the Y-axis direction of the coupler 71C each to be not less than 1 μm. The stress that is generated at the coupler 71C can be further relaxed thereby.

Or, as shown in FIG. 15, the structure body 70 may be a polygon in which the corners are curved when viewed from the Z-axis direction. In other words, the coupler 71C may be curved when viewed from the Z-axis direction. In the example of FIG. 15, the structure body 70 is a rounded rectangle when viewed from the Z-axis direction. The stress at the corners of the structure body 70 can be relaxed by such a structure.

For example, one end of the coupler 71C that is linked to the first extension portion 71-1 is along the Y-axis direction. The other end of the coupler 71C that is linked to the second extension portion 71-2 is along the X-axis direction. Thereby, the coupler 71C is smoothly linked to the first and second extension portions 71-1 and 71-2. Similarly, the coupler 71C may be curved when viewed from the Z-axis direction. By curving the coupler 71C, the concentration of the stress at the structure body 70 can be further relaxed.

The structure of the light detector is not limited to the illustrated examples; and various modifications are possible. For example, when viewed from the Z-axis direction, the shape of the structure body 70 (a first structure body) that surrounds one of the multiple photodiodes PD (a first photodiode) may be different from the shape of another structure body 70 (a second structure body) that surrounds another one of the multiple photodiodes PD (a second photodiode). When viewed along the Z-direction, the shape of the first photodiode may be different from the shape of the second photodiode. When viewed along the Z-direction, the surface area of the first photodiode may be different from the surface area of the second photodiode. The electrical resistance of the quenching part 63 that is electrically connected with the first photodiode and the electrical resistance of the quenching part 63 that is electrically connected with the second photodiode may be different from each other. The operating voltages that are applied to the first interconnect 51 that is electrically connected with the first photodiode and the first interconnect 51 that is electrically connected with the second photodiode may be different from each other. The signal of the first interconnect 51 that is electrically connected with the first photodiode and the signal of the first interconnect 51 that is electrically connected with the second photodiode may be separately read.

Simulations based on theoretical calculations for the light detectors of the first and second embodiments will now be described. In the following simulations, the semiconductor layer 22 is a high-concentration p-type substrate having a boron concentration of $4.5 \times 10^{18}/cm^3$; the semiconductor layer 21 is a semiconductor layer having a boron concentration of $1.0 \times 10^{15}/cm^3$; and the first period L1 of the element 10 (the light-receiving cell) is 12.5 μm.

Figure 16A:
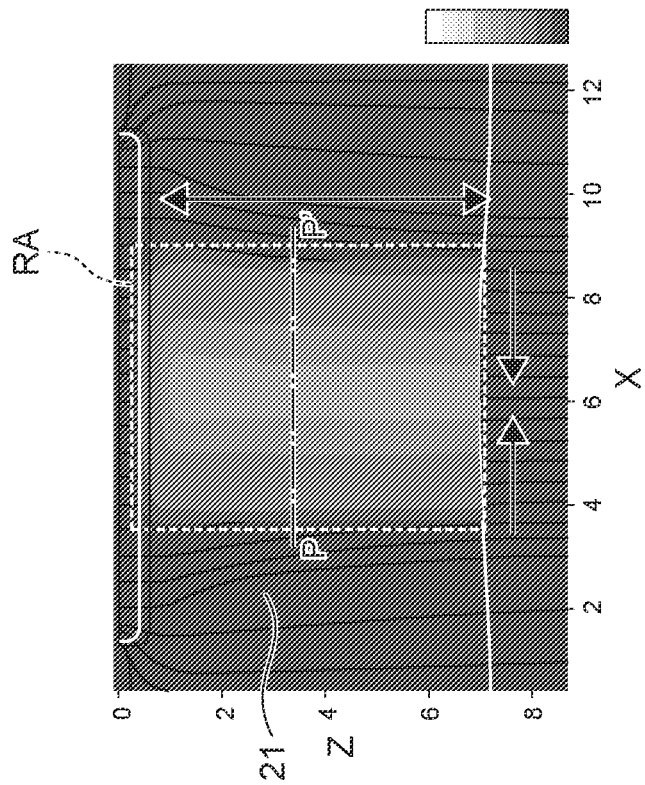
FIGS. 16A and 16B are schematic cross-sectional views illustrating calculation results of the distribution range of the avalanche region of the light detector.
Figure 16B:
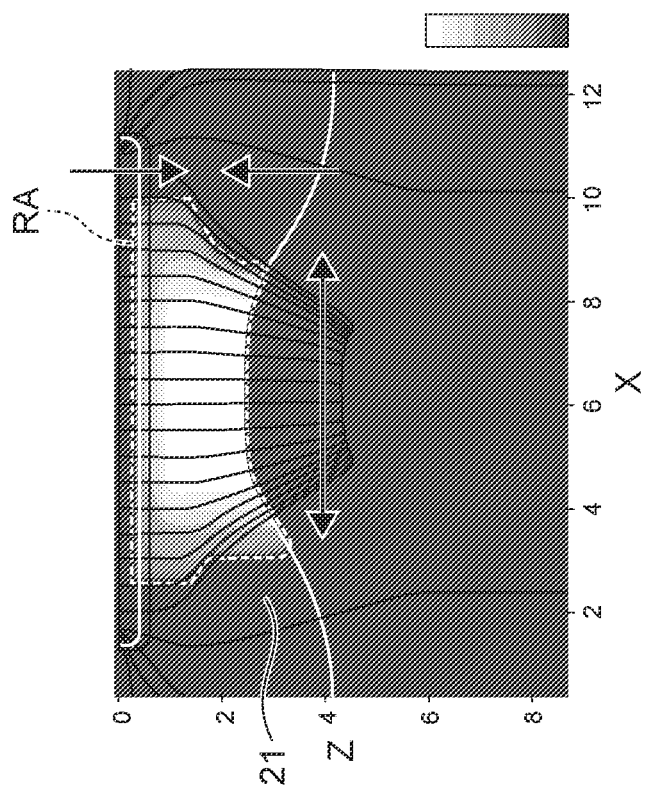

FIGS. 16A and 16B are schematic cross-sectional views illustrating calculation results of the distribution range of the avalanche region of the light detector.

First, the distribution of the region (the avalanche region) in which there is a likelihood (an avalanche probability) of avalanche multiplication of the carriers generated in the semiconductor layer 21 was confirmed by a theoretical calculation. The shading of the colors in the figures illustrates the level of the avalanche probability. The avalanche probability is lower as the color is darker (black); and the avalanche probability is higher as the color is lighter (white). For the light detector to obtain a high photon detection efficiency, it is desirable for the overlap between the avalanche region and the optical path of the incident light in the light-receiving element to be large.

The distribution of the avalanche region is affected by the impurity concentration profile in the semiconductor layer 21. FIGS. 16A and 16B show the avalanche region distribution of the light-receiving cell in which the boron (B) implantation conditions for making the second semiconductor region 12 are modified between two conditions.

FIG. 16A is the result of the calculation of the avalanche region distribution when the boron conditions include an acceleration voltage of 400 keV and a dose of $3.3 \times 10^{12}/cm^2$. FIG. 16B is the result of the calculation of the avalanche region distribution when the boron implantation conditions include an acceleration voltage of 400 keV and a dose of $2.6 \times 10^{12}/cm^2$. The voltage applied to the light-receiving cell was set to a voltage that was 5 V greater than the breakdown voltage.

The peak of the impurity concentration profile of FIG. 16A is higher than the peak of the impurity concentration profile of FIG. 16B. In FIG. 16A, the avalanche region spreads in the X-axis direction (and the Y-axis direction) and has little spreading in the Z-axis direction. For example, in FIG. 16A, the length along the Z-axis direction of a distribution range RA of the avalanche region is less than the length along the X-axis direction of the distribution range RA of the avalanche region. On the other hand, in FIG. 16B, the avalanche region has little spreading in the X-axis direction (and the Y-axis direction), but spreads in the Z-axis direction. For example, in FIG. 16B, the length along the Z-axis direction of the distribution range RA of the avalanche region is greater than the length along the X-axis direction of the distribution range RA of the avalanche region.

For example, the light detector according to the embodiment is used to detect near-infrared light for LiDAR (e.g., a wavelength that is not less than 0.7 μm and not more than 2.5 μm). Penetration length of near-infrared light into the semiconductor layer 21 is long. In such a case, it is desirable for the overlap between the avalanche region and the optical path of the incident light to be large to increase the light detection efficiency of the light detector. For example, a light-receiving element that includes an avalanche region such as that of FIG. 16B is desirable.

As described above in the second embodiment, when a trench structure such as the structure body 70 is used, for example, defects that are caused by the thermal expansion coefficient difference occur at the interface vicinity between the trench structure and the semiconductor layer 21. The avalanche multiplication due to thermions generated at the defects causes noise output of the light detector. Therefore, to reduce the noise of the light detector, a shape of the avalanche region such as that of FIG. 16B is more desirable than a shape of the avalanche region such as that of FIG. 16A. For example, when operating the element 10, the length along the Z-axis direction of the depletion layer that is formed by the second and third semiconductor regions 12 and 13 may be greater than the length along the X-axis direction of the depletion layer.

FIG. 16B corresponds to the calculation results performed for the light-receiving elements shown in FIGS. 3A to 3C.

Figure 17:
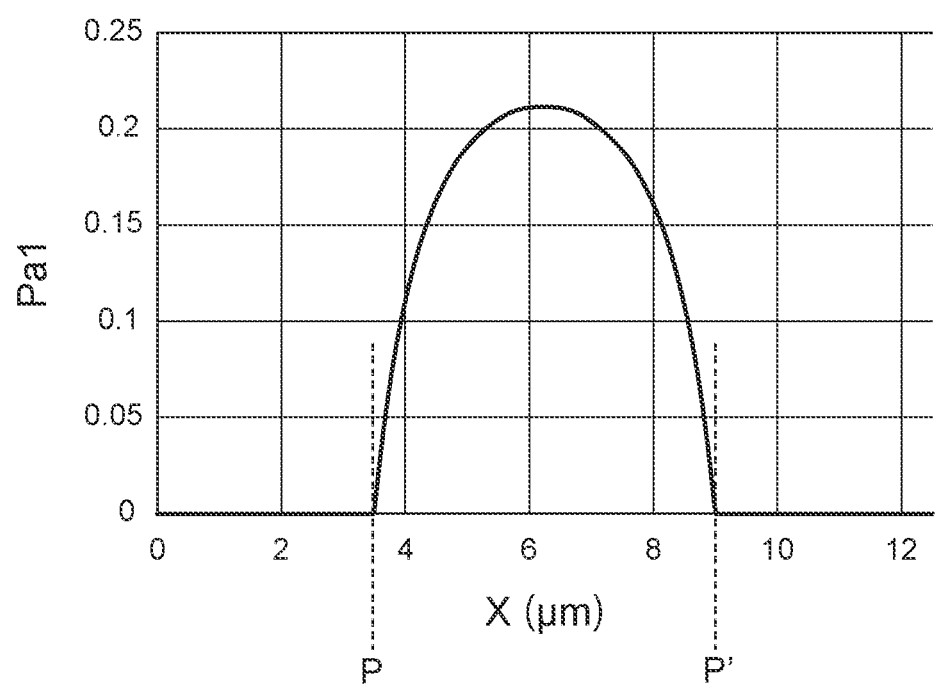
FIG. 17 is a graph illustrating calculation results of the distribution of the avalanche probability.

FIG. 17 is a graph illustrating calculation results of the distribution of the avalanche probability. FIG. 17 shows calculation results of the distribution of an avalanche probability Pa1 in a range p-p' of the avalanche region shown in FIG. 16B. The avalanche probability increases proximate to the element center and decreases proximate to the element end portion that is separated from the element center. Therefore, the light detection efficiency increases as the optical path of the incident light passes proximate to the light-receiving element center.

FIGS. 18A to 18C are schematic cross-sectional views illustrating calculation results of the optical path of the light detector.

FIGS. 18A to 18C illustrate the distribution range RA of the avalanche region shown in FIG. 16B overlaid on FIGS. 3A to 3C.

As illustrated in FIG. 18A, when the thickness of the refracting layer 30 to the first period L1 (I/L1) is 0.08, much of the incident light passes through the distribution range RA of the avalanche region, but the light also passes through an avalanche region edge of low avalanche probability (the end portion of the distribution range RA).

As illustrated in FIG. 18B, when the thickness of the refracting layer 30 to the first period L1 (I/L1) is 0.4, the optical path concentrates more in the distribution range RA of the avalanche region, and much of the incident light passes through the element center at which the avalanche probability is high.

As illustrated in FIG. 18C, when the thickness of the refracting layer 30 to the first period L1 (I/L1) is 1.2, the convergence of the optical path is too early; therefore, the optical path starts to re-diverge where the light reaches the avalanche region. Therefore, a portion of the incident light passes through an avalanche region edge of low avalanche probability.

Third Embodiment

Figure 19:
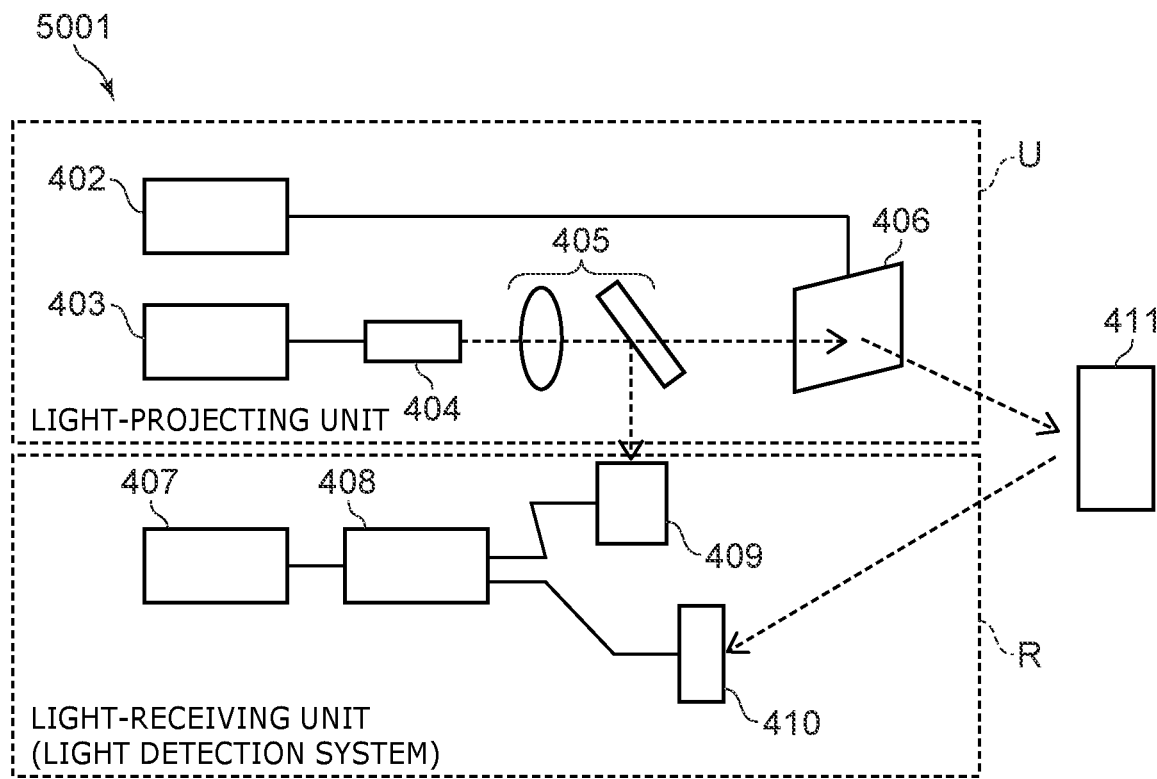
FIG. 19 is a schematic view illustrating a lidar (Laser Imaging Detection and Ranging (LIDAR)) device according to a third embodiment.

FIG. 19 is a schematic view illustrating a lidar (Laser Imaging Detection and Ranging (LIDAR)) device according to a third embodiment.

The embodiment is applicable to a long-distance subject detection system (LIDAR) or the like including a line light source and a lens. The lidar device 5001 includes a light-projecting unit U that projects laser light toward an object 411, and a light-receiving unit R (also called a light detection system) that receives the laser light from the object 411, measures the time of the round trip of the laser light to and from the object 411, and converts the time into a distance.

In the light-projecting unit U, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light-receiving unit R, a reference light detector 409 detects the reference light extracted by the optical system 405. A light detector 410 receives the reflected light from the object 411. A distance measuring circuit 408 measures the distance to the object 411 based on the reference light detected by the reference light detector 409 and the reflected light detected by the light detector 410. An image recognition system 407 recognizes the object 411 based on the results measured by the distance measuring circuit 408.

The lidar device 5001 employs ToF in which the time (the time-of-flight) of the round trip of the laser light to and from the object 411 is measured and converted into a distance.

The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band invisible to humans. For example, the lidar device 5001 can be used for obstacle detection in a vehicle.

Figure 20:
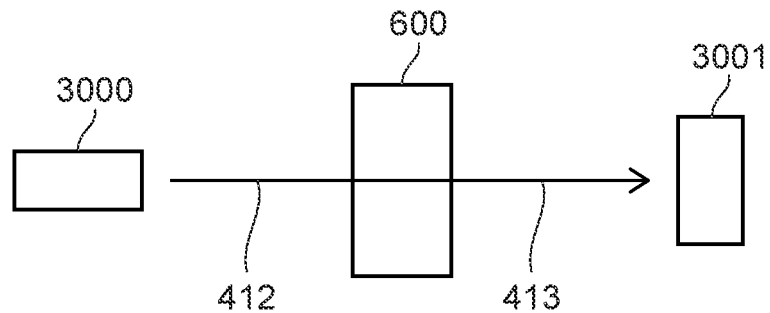
FIG. 20 is a drawing for describing the detection of the detection object of the lidar device.

FIG. 20 is a drawing for describing the detection of the detection object of the lidar device.

A light source 3000 emits light 412 toward an object 600 that is the detection object. A light detector 3001 detects light 413 that passes through the object 600, is reflected by the object 600, or is diffused by the object 600.

For example, the light detector 3001 realizes highly-sensitive detection when the light detector according to the embodiment described above is used. It is favorable to provide multiple sets of the light detector 410 and the light source and to preset the arrangement relationship in the software (which is replaceable with a circuit). For example, it is favorable for the arrangement relationship of the sets of the light detector 410 and the light source to be at uniform spacing. Thereby, an accurate three-dimensional image can be generated by the output signals of each light detector 410 complementing each other.

Figure 21:
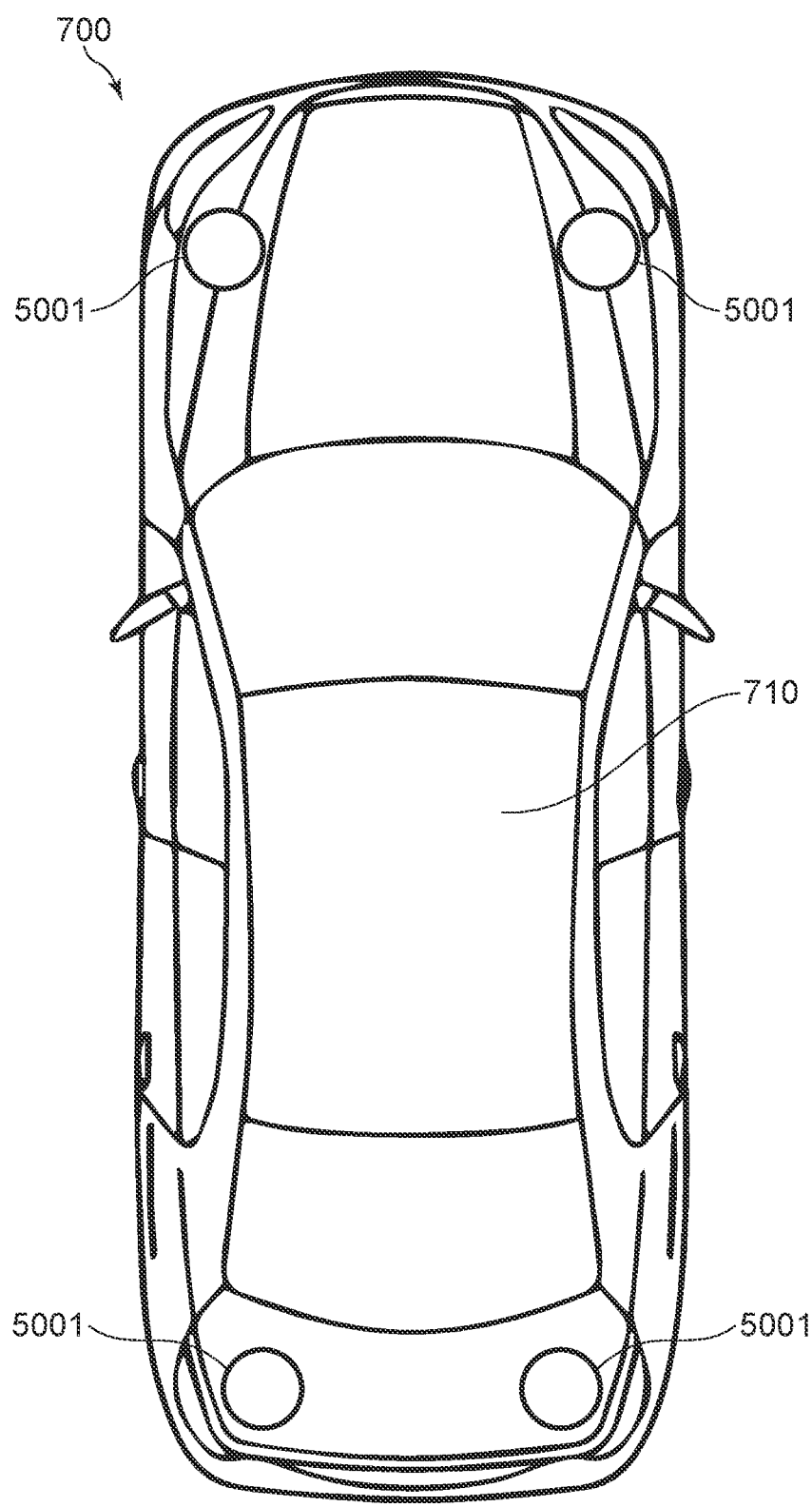
FIG. 21 is a schematic top view of a vehicle that includes the lidar device according to the third embodiment.

FIG. 21 is a schematic top view of a vehicle that includes the lidar device according to the third embodiment.

For example, the lidar device 5001 is mounted in a mobile body such as a vehicle, a drone, a robot, etc. In the example of FIG. 21, a vehicle 700 is used as the mobile body. The vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, SIMS (secondary ion mass spectrometry).

According to embodiments, a light detector, a light detection system, a lidar device, a mobile body, and a vehicle can be provided in which the performance can be improved.

In the specification of the application, "perpendicular" refer to not only strictly perpendicular but also include, for example, the fluctuation due to manufacturing processes, etc. It is sufficient to be substantially perpendicular.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light detectors such as multiple elements, quenching parts, multiple lenses, refracting layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light detectors, light detection systems, lidar devices, mobile bodies, and vehicles practicable by an appropriate design modification by one skilled in the art based on the light detectors, the light detection systems, the lidar devices, the mobile bodies, and the vehicles described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:
a plurality of elements, each of the elements including a first semiconductor region of a first conductivity type, a second semiconductor region of the first conductivity type, and a third semiconductor region of a second conductivity type, the second semiconductor region being located on the first semiconductor region and having a higher first-conductivity-type impurity concentration than the first semiconductor region, the third semiconductor region being located on the second semiconductor region, the elements being arranged at a first period in a second direction crossing a first direction, the first direction being from the first semiconductor region toward the second semiconductor region;
a quenching part electrically connected with the third semiconductor region;
a plurality of lenses located respectively on the elements, one of the lenses being positioned on one of the elements; and
a refracting layer located between the elements and the lenses, the refracting layer having a first thickness, a ratio of the first thickness to the first period being not less than 0.16 and not more than 0.72.

2. The detector according to claim 1, wherein
a first semiconductor layer includes the first to third semiconductor regions,
a thickness of the first semiconductor layer is a second thickness, and
a ratio of the second thickness to the first period is not less than 0.4 and not more than 1.2.

3. The detector according to claim 1, wherein
the refracting layer includes:
a first layer located between the lenses and the elements; and
a second layer located between the first layer and the lenses.

4. The detector according to claim 1, further comprising:
a conductive part connecting the third semiconductor region and the quenching part,
at least a portion of the conductive part being surrounded with the refracting layer in a plane perpendicular to the first direction.

5. The detector according to claim 1, wherein
the first period is not more than 15 micrometers.

6. The detector according to claim 1, wherein
the first thickness is not less than 2 micrometers and not more than 8 micrometers.

7. The detector according to claim 1, wherein
the second semiconductor region and the third semiconductor region are surrounded with a portion of the first semiconductor region in a plane perpendicular to the first direction.

8. The detector according to claim 1, further comprising:
a first structure body having a different refractive index from the first semiconductor region,
the elements including a first element and a second element,
the first element and the second element being adjacent to each other,
at least a portion of the first structure body being located between the first semiconductor region of the first element and the first semiconductor region of the second element.

9. The detector according to claim 8, further comprising:
a second structure body having a different refractive index from the first semiconductor region,
at least a portion of the second structure body being located between the at least a portion of the first structure body and the first semiconductor region of the second element,
the at least a portion of the first structure body and the at least a portion of the second structure body being separated from each other.

10. The detector according to claim 9, wherein
the first structure body and the second structure body respectively surround the first element and the second element.

11. The detector according to claim 10, wherein
at least one of the first structure body or the second structure body is octagonal when viewed along the first direction.

12. The detector according to claim 8, wherein
the first structure body surrounds the first element.

13. The detector according to claim 8, wherein
the first structure body discontinuously surrounds the first element when viewed along the first direction.

14. The detector according to claim 8, further comprising:
a second semiconductor layer of the first conductivity type, the second semiconductor layer having a higher first-conductivity-type impurity concentration than the first semiconductor region,
the first semiconductor region being located on the second semiconductor layer,
a lower portion of the first structure body being surrounded with the second semiconductor layer.

15. The detector according to claim 8, wherein
an upper portion of the first structure body is surrounded with the refracting layer.

16. The detector according to claim 1, wherein
the elements are avalanche photodiodes operating in a Geiger mode.

17. A light detection system, comprising:
the light detector according to claim 1; and
a distance measuring circuit calculating a time-of-flight of light from an output signal of the light detector.

18. A lidar device, comprising:
a light source irradiating light on an object; and
the light detection system according to claim 17 detecting light reflected by the object.
19. A mobile body, comprising:
the lidar device according to claim 18.
20. A vehicle, comprising:
a plurality of the lidar devices according to claim 18; and
a vehicle body,
the lidar devices being located at four corners of the vehicle body.

* * * * *